US011043266B1

(12) United States Patent
Tagar et al.

(10) Patent No.: US 11,043,266 B1
(45) Date of Patent: Jun. 22, 2021

(54) MULTI-LEVEL READ AFTER HEATING EVENT IN NON-VOLATILE STORAGE

(71) Applicant: Western Digital Technologies, Inc., San Jose, CA (US)

(72) Inventors: Hadar Tagar, Kfar Saba (IL); Alon Eyal, Zichron Yaacov (IL); David Rozman, Kiryat Malakhi (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/901,524

(22) Filed: Jun. 15, 2020

(51) Int. Cl.
*G11C 11/56* (2006.01)
*G11C 16/04* (2006.01)
*G11C 16/26* (2006.01)
*G11C 16/10* (2006.01)
*H01L 27/11582* (2017.01)
*H01L 27/11519* (2017.01)
*H01L 27/11565* (2017.01)
*H01L 27/11556* (2017.01)

(52) U.S. Cl.
CPC ...... *G11C 11/5642* (2013.01); *G11C 11/5671* (2013.01); *G11C 16/0483* (2013.01); *G11C 16/10* (2013.01); *G11C 16/26* (2013.01); *H01L 27/11519* (2013.01); *H01L 27/11556* (2013.01); *H01L 27/11565* (2013.01); *H01L 27/11582* (2013.01)

(58) Field of Classification Search
CPC . G11C 11/5642; G11C 16/10; G11C 16/0483; G11C 11/5671; G11C 16/26; H01L 27/11565; H01L 27/11556; H01L 27/11519; H01L 27/11582
See application file for complete search history.

(56) References Cited

U.S. PATENT DOCUMENTS

| 8,254,170 | B2 | 8/2012 | Eli et al. |
| 8,484,542 | B2 | 7/2013 | d' Abreu et al. |
| 8,788,741 | B2 | 7/2014 | Kwon et al. |
| 9,037,946 | B2 | 5/2015 | Jeon et al. |
| 9,165,670 | B2 | 10/2015 | Mekhanik et al. |
| 9,179,717 | B2 | 11/2015 | Lipinski |
| 9,229,806 | B2 | 1/2016 | Mekhanik et al. |
| 9,431,121 | B2 | 8/2016 | Muchherla et al. |
| 9,472,270 | B2 * | 10/2016 | Liang .................. G11C 11/5642 |
| 9,704,595 | B1 | 7/2017 | Eyal et al. |
| 9,711,231 | B1 | 7/2017 | Yip et al. |

(Continued)

*Primary Examiner* — David Lam
(74) *Attorney, Agent, or Firm* — Vierra Magen Marcus LLP

(57) ABSTRACT

Technology is disclosed herein for operating a non-volatile memory system following a heating event such as an Infrared (IR) reflow process. The memory system is pre-loaded with data that is stored at multiple bits per memory cell. After the heating event, the memory system calibrates the read reference levels for reading the memory cells at multiple bits per memory cell. However, prior to calibrating the read reference levels, the memory system stabilizes one or more conditions in the memory system, which allows the new read reference levels to be accurately calibrated. The memory system may stabilizes threshold voltage of memory cells and/or word line voltages, for example. In one aspect, a dummy read is performed to stabilize one or more conditions of the memory system. Hence, the read reference levels may be accurately calibrated.

21 Claims, 20 Drawing Sheets

(56) References Cited

U.S. PATENT DOCUMENTS

| | | |
|---|---|---|
| 9,952,944 B1 | 4/2018 | Alrod et al. |
| 10,026,486 B1 | 7/2018 | Dutta et al. |
| 10,157,676 B2 | 12/2018 | Pang et al. |
| 2010/0169547 A1 | 7/2010 | Ou |
| 2014/0229664 A1 | 8/2014 | Bar-or et al. |
| 2016/0118112 A1 | 4/2016 | Liang et al. |
| 2018/0114580 A1 | 4/2018 | Alrod et al. |
| 2019/0066775 A1 | 2/2019 | Jean et al. |

\* cited by examiner

Figure 4C
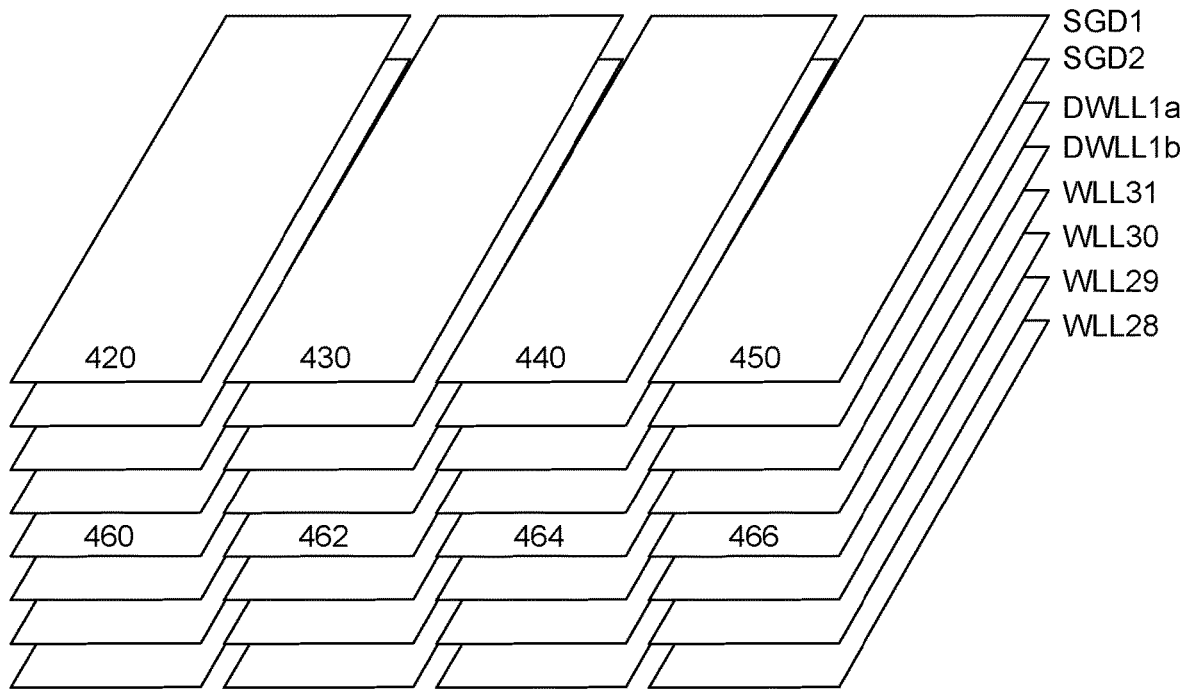
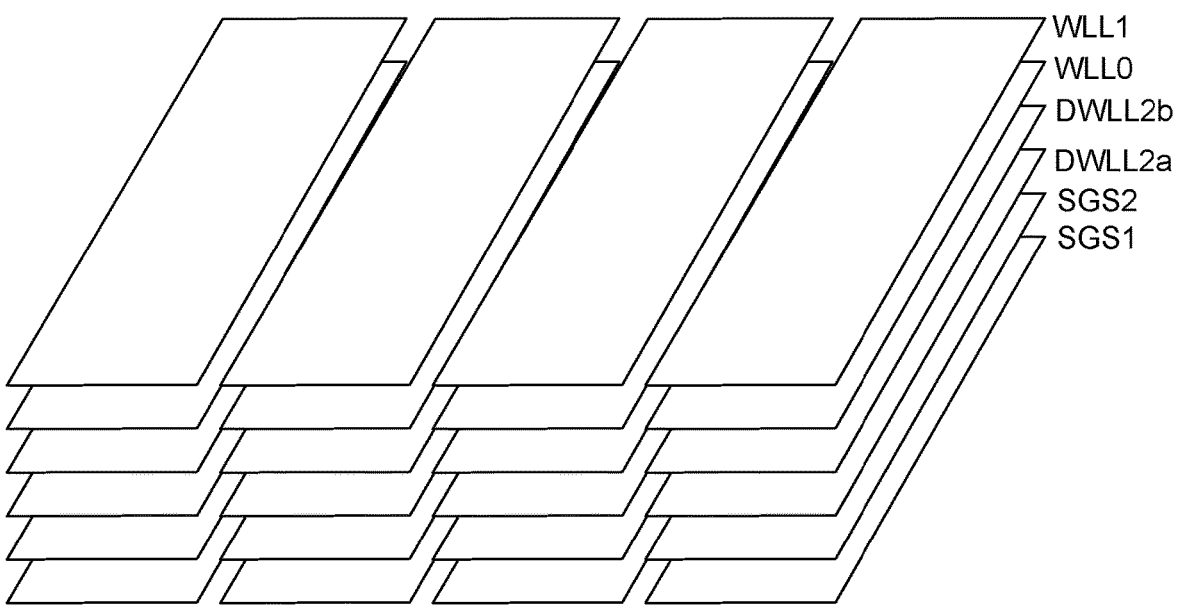

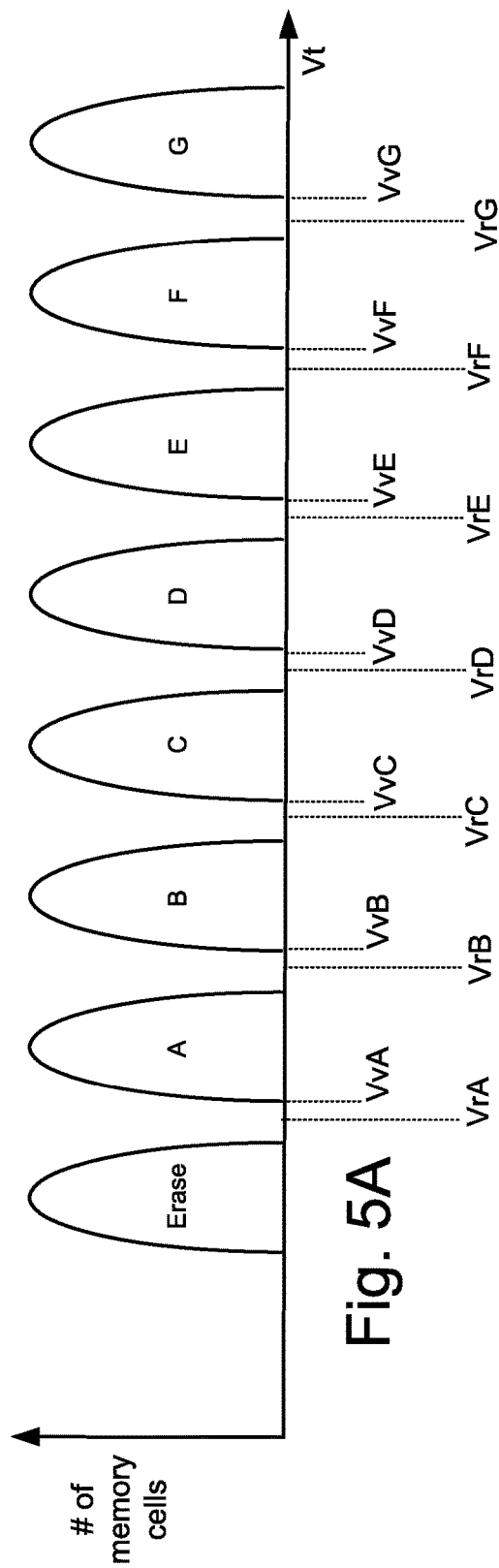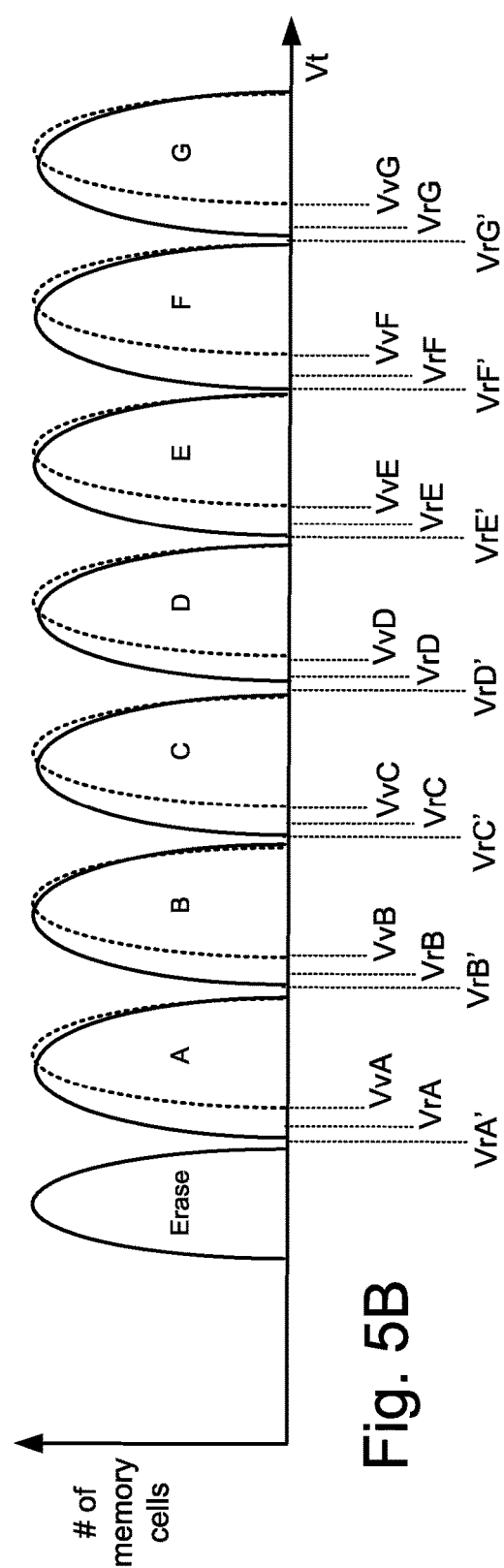

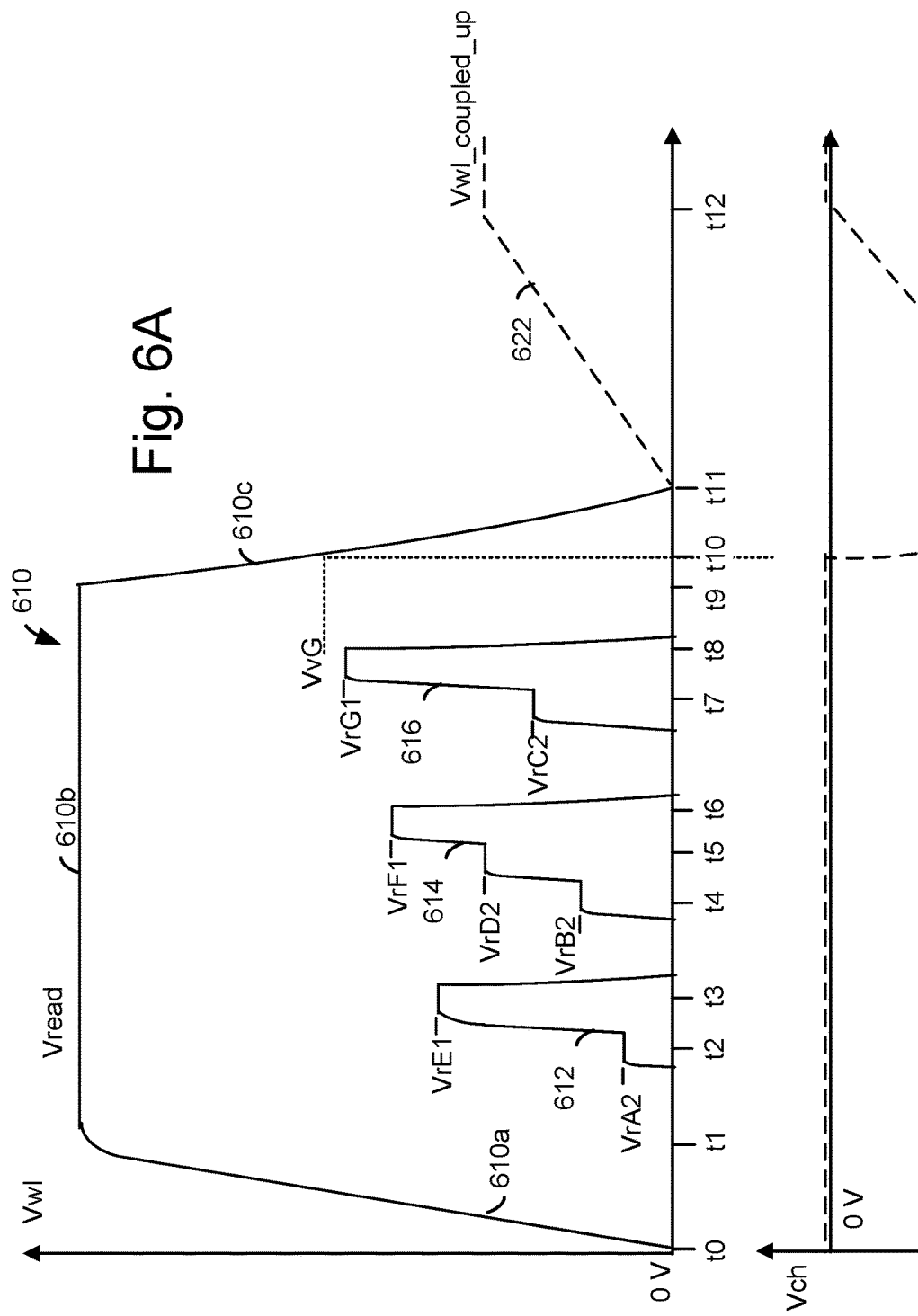

MULTI-LEVEL READ AFTER HEATING EVENT IN NON-VOLATILE STORAGE

BACKGROUND

Many electronic devices make use of an embedded or otherwise connected storage devices. Often, the embedded or connected storage device includes non-volatile memory. A host refers to a device that makes use of a storage device. A host can be connected to the storage device, or the storage device can be embedded within the host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a storage device that uses semiconductor based non-volatile memory is a solid state device ("SSD").

The basic unit of storage in non-volatile storage systems is a memory cell. In some embodiments, memory cells store one bit of data and are referred to as Single Level Cells ("SLC"). An SLC memory cell can either be in an erased data state or a programmed data state. In other embodiments, memory cells store multiple bits of data and are referred to as Multi Level Cells ("MLC"). MLC memory cells can store two bits of data per memory cell, three bits of data per memory cell, four bits of data per memory cell, etc. An MLC memory cell can be in an erased data state or any one of multiple programmed data states. For example, an MLC memory cell that stores three bits of data (referred to as a three level cell—TLC), can be in an erased data state or any one of seven programmed data states.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block.

Some non-volatile memory cells store information in a charge storage region that is insulated from a channel region of a transistor formed by the memory cell. As one example, a floating gate is adjacent to and insulated from the channel region. The floating gate may be positioned between source and drain regions of the transistor formed by the memory cell. A control gate is provided adjacent to and insulated from the floating gate. The threshold voltage (VT) of the memory cell transistor is controlled by the amount of charge that is retained on the floating gate. That is, the minimum amount of voltage that must be applied to the control gate before the transistor is turned on to permit conduction between its source and drain is controlled by the level of charge on the floating gate. Some non-volatile memory cells have a charge trapping layer as the charge storage region of the memory cell transistor to store information. One such example has an oxide-nitride-oxide (ONO) region, in which the nitride (e.g., SiN) serves as a charge trapping layer to store information. When such a memory cell is programmed, electrons are stored in the charge trapping layer. In this manner, the VT of the memory cell may be established.

To store one bit per memory cell, the memory cells may be programmed to two distinct distributions of threshold voltages. To store two-bits per memory cell, the memory cells may be programmed to four distinct distributions of threshold voltages. To store three-bits per memory cell, the memory cells may be programmed to eight distinct distributions of threshold voltages. Read reference voltage levels are used to distinguish between the different VT distributions. Over time, a memory cell may lose charge from the charge storage region, which may cause its VT to drop. If the memory cell loses enough charge, its VT may drop below the VT distribution to which it was originally programmed. This is referred to as a data retention issue.

BRIEF DESCRIPTION OF THE DRAWINGS

Like-numbered elements refer to common components in the different Figures.

FIG. 4C depicts a perspective view of the conductive layers for the block that is partially depicted in FIG. 4B.

FIG. 5A illustrates example threshold voltage distributions (ranges) for MLC memory cells that store three bits of data.

FIG. 5B shows VT distributions illustrating charge loss for memory cells in the A-state through the G-state.

FIG. 6A depicts a plot of example waveforms in a read operation.

FIG. 6B depicts a plot of a channel voltage (Vch) corresponding to FIG. 6A.

DETAILED DESCRIPTION

Figure 1A:
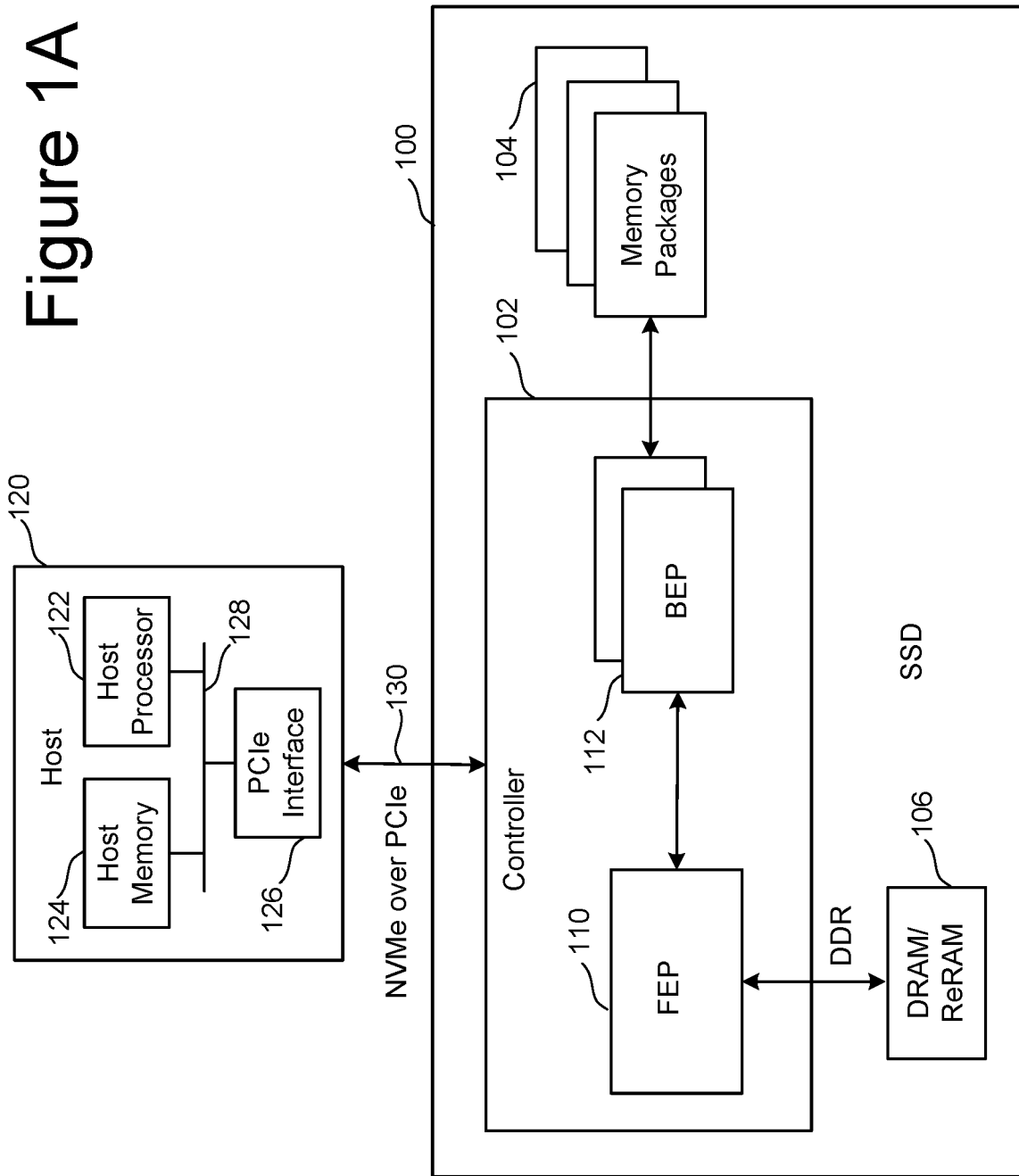
FIG. 1A is a block diagram of one embodiment of a storage device connected to a host.

Technology is disclosed herein for operating a non-volatile memory system following a heating event such as an Infrared (IR) reflow process. In some embodiments, the memory system is pre-loaded with data that is stored at multiple bits per memory cell, which allows for a large amount of data to be pre-loaded. Herein, "pre-loaded data" means that the data is stored in the non-volatile memory cells prior to the heating event (e.g., IR reflow process). The heating event may cause charge loss in memory cells, making it difficult to read the memory cells.

In an embodiment, after the heating event, the memory system calibrates the read reference levels for reading the memory cells at multiple bits per memory cell. In an embodiment, prior to calibrating the read reference levels, the memory system stabilizes one or more conditions in the memory system, which allows the new read reference levels to be accurately calibrated. In one embodiment, the memory system stabilizes threshold voltages of memory cells, which allows the read reference levels to be accurately calibrated. In one embodiment, the memory system stabilizes word line voltages, which allows the read reference levels to be accurately calibrated. In one embodiment, the memory system performs a dummy read to stabilize one or more conditions in the memory system. In one embodiment, a dummy read is similar to a read command, but the memory cells are typically not sensed during the dummy read. Also, the voltages applied to the word lines are not intended to determine the VT of a memory cell. In one embodiment of a dummy read, the control gates of memory cells on a NAND receives a dummy voltage that has a magnitude that is at least as great as the highest voltage used to verify the memory cells. After the control gate voltages are brought down to a steady state value, the control gates are floated. The dummy read stabilizes memory cell threshold voltages and/or control gate voltages. By stabilizing the one or more conditions, the memory system is able to accurately calibrate the read reference levels after a heating event. Therefore, the memory system can pre-load a large amount of data at multiple bits per memory cell, and use the calibrated read reference levels to quickly and accurately read the pre-loaded data.

An IR reflow process may be used to attach a surface mount device that houses the non-volatile storage device to a printed circuit board, or the like. For example, a ball-grid array (BGA) package may employ hundreds of tiny solder balls on the bottom of the package to provide the leads needed to connect to sophisticated integrated circuits. Solder reflow is a process in which solder paste is used to temporarily attach an electrical component to contact pads. Then, controlled heat is used to melt the solder, permanently connecting the electrical component to the contact pads. The heating can use a high temperature profile that could be accomplished by passing the package through a reflow oven or using an infrared lamp. The temperature could reach 260 degrees Celsius, in one example process.

The effect of the high heat on memory devices including, but not limited to, flash memory devices may be similar to the data loss that occurs over time due to the data retention issue mentioned above. The effect of the soldering process could be similar to several years of data loss without extreme heating. The brief high temperature may accelerate charge loss from the charge storage regions.

The memory system may have some data programmed therein even prior to soldering the memory system to the host device. For example, an operating system may be stored in the memory system at time of manufacture. Therefore, the soldering process could degrade data retention or even cause data loss. The memory system may undergo more than one heating event. For example, two sides of the memory system could be soldered during two separate IR reflow processes. Also, one of the IR reflow processes might be repeated. Thus, the memory system might undergo one, two, three, or some other number of heating events, such as IR reflow processes.

Since the IR reflow will typically cause charge loss, and hence a drop of memory cell VT, recalibrating read reference levels can be used to read the pre-loaded data. Calibrating read reference levels may involve sensing the memory cells a number of times, at different read reference levels. However, the threshold voltages of the memory cells depend on the conditions in the memory structure when the memory cells are sensed. If the conditions change from one sensing operation to the next, threshold voltages of the memory cells may change from one sensing operation to the next. If the threshold voltages of the memory cells change from one sensing operation to the next, the read reference level calibration process could fail, and at best will be inaccurate.

One condition that may change is a voltage on word lines connected to the memory cells. A "first read" situation can be defined in which the word line voltages are not coupled up, and a "second read" situation can be defined in which the word line voltages are coupled up. The memory cell's VT can be different depending on whether the word line voltages are coupled up. Other conditions could also impact the memory cell's VT, such as residual electrons in a memory cell channel. By an embodiment of a memory system stabilizing a condition (e.g., memory cell VT, word line voltages) after the IR reflow, the read reference levels can be accurately calibrated. Therefore, the pre-loaded data can be quickly and accurately read using the re-calibrated read reference levels.

FIG. 1A is a block diagram of one embodiment of a storage device 100 connected to a host 120. Storage device 100 can implement the technology proposed herein. Many different types of storage devices can be used with the technology proposed herein. One example storage device is a solid state device (SSD); however, other types of storage devices can also be used. Storage device 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip (SoC). FEP 110 and BEP 112 both include their own processors. In one embodiment, FEP110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction, control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with storage device 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from storage device 100. In one embodiment, storage device 100 is embedded in host 120. Any combination of one or more of storage device 100, controller 102, FEP 110, BEP 112, and/or memory packages 104 may be referred to herein as an apparatus. In operation, when the host 120 needs to read data from or write data to the non-volatile memory 104, it will communicate with the controller 102. If the host 120 provides a logical address to which data is to be read/written, the controller can convert the logical address received from the host to a physical address in the non-volatile memory 104.

Figure 1B:
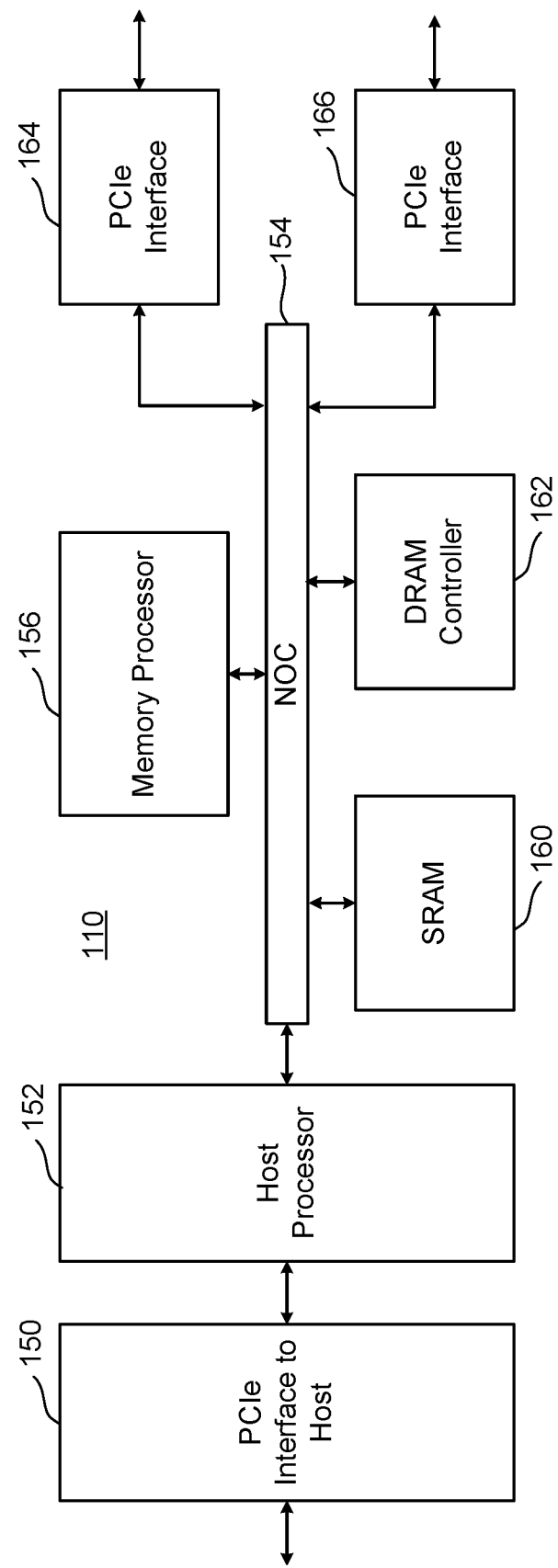
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
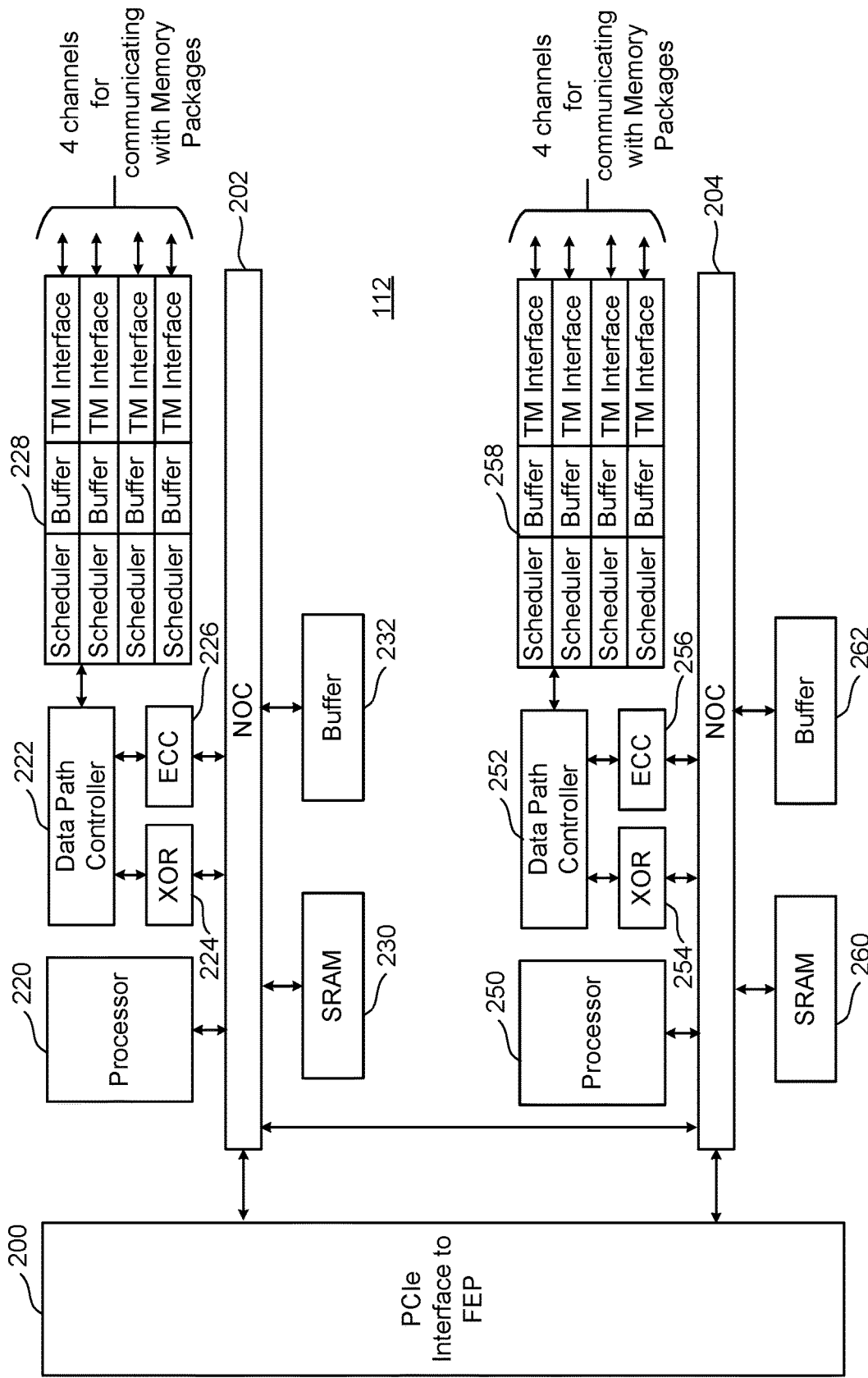
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs (Network-on-a-Chip) 202 and 204. In one embodiment, the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a UECC failure. In an embodiment, XOR engines 224/254 form a bitwise XOR of different pages of data. The XOR result may be stored in a memory package 104. In the event that an ECC engine 226/256 is unable to successfully correct all errors in a page of data that is read back from a memory package 104, the stored XOR result may be accessed from the memory package 104. The page of data may then be recovered based on the stored XOR result, along with the other pages of data that were used to form the XOR result.

Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Interfaces 228/258, alone or in combination, may be referred to as a memory interface configured to be connected to non-volatile memory (e.g., memory package 104). A combination of one or more of processor 220/250, data path controller 222/252, XOR 224/254, ECC 226/256 may be referred to herein as a processor circuit. The buffer 232/262, SRAM 230/260, and/or NOCs 202/204 may also be considered to be a part of the processor circuit.

Figure 1D:
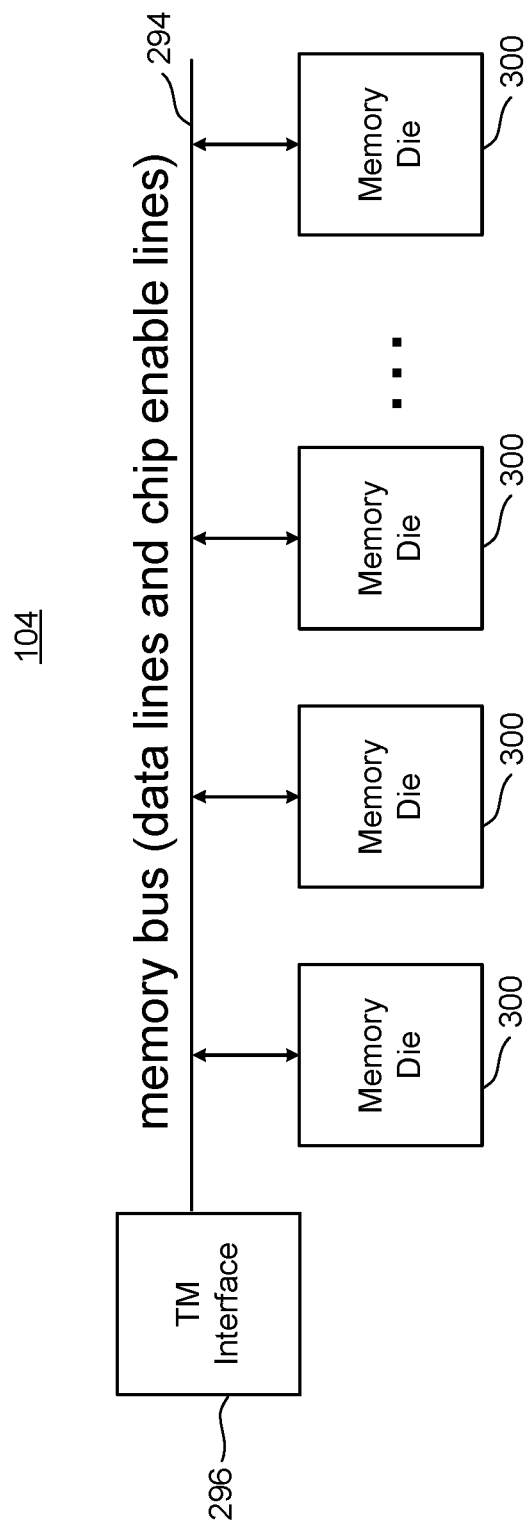
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2A:
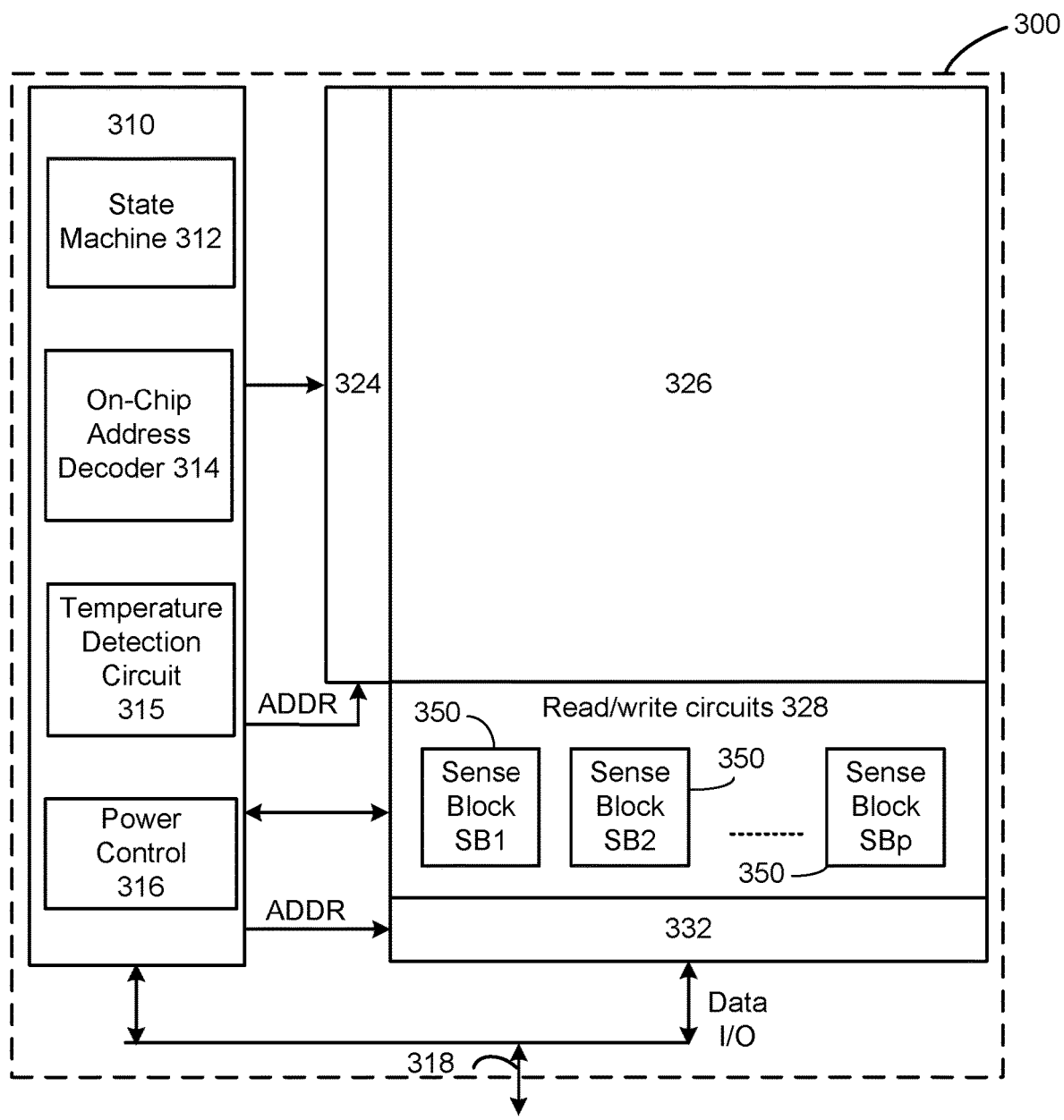
FIG. 2A is a block diagram of one embodiment of a memory die.

FIG. 2A is a functional block diagram of one embodiment of a memory die 300. Each of the one or more memory die 300 of FIG. 1D can be implemented as memory die 300 of FIG. 2A. The components depicted in FIG. 2A are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface and an Open NAND Flash Interface (ONFI). Other I/O interfaces can also be used.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326.

The temperature detection circuit 315 is configured to measure temperature on the memory die 300. The memory die 300 reports temperature information to the memory controller 102.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits connected to memory structure 326. This one or more control circuits are an electrical circuit that performs the functions described below in the flow charts. In other embodiments, the one or more control circuits can consist only of controller 102 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 102 and control circuitry 310 performing the functions described below in the flow charts. In another embodiment, the one or more control circuits comprises state machine 312 (and/or a microcontroller and/or microprocessor) alone or in combination with controller 102. In another alternative, the one or more control circuits comprises controller 102, control circuitry 310, read/write circuits 328 and decoders 324/332 performing the functions described below in the flow charts. In other embodiments, the one or more control circuits comprises one or more electrical circuits that operate the non-volatile memory. The term apparatus as used herein may include, but is not limited to, memory die 300, non-volatile memory 104, storage device 100, or a host system 120 that includes a storage device 100.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
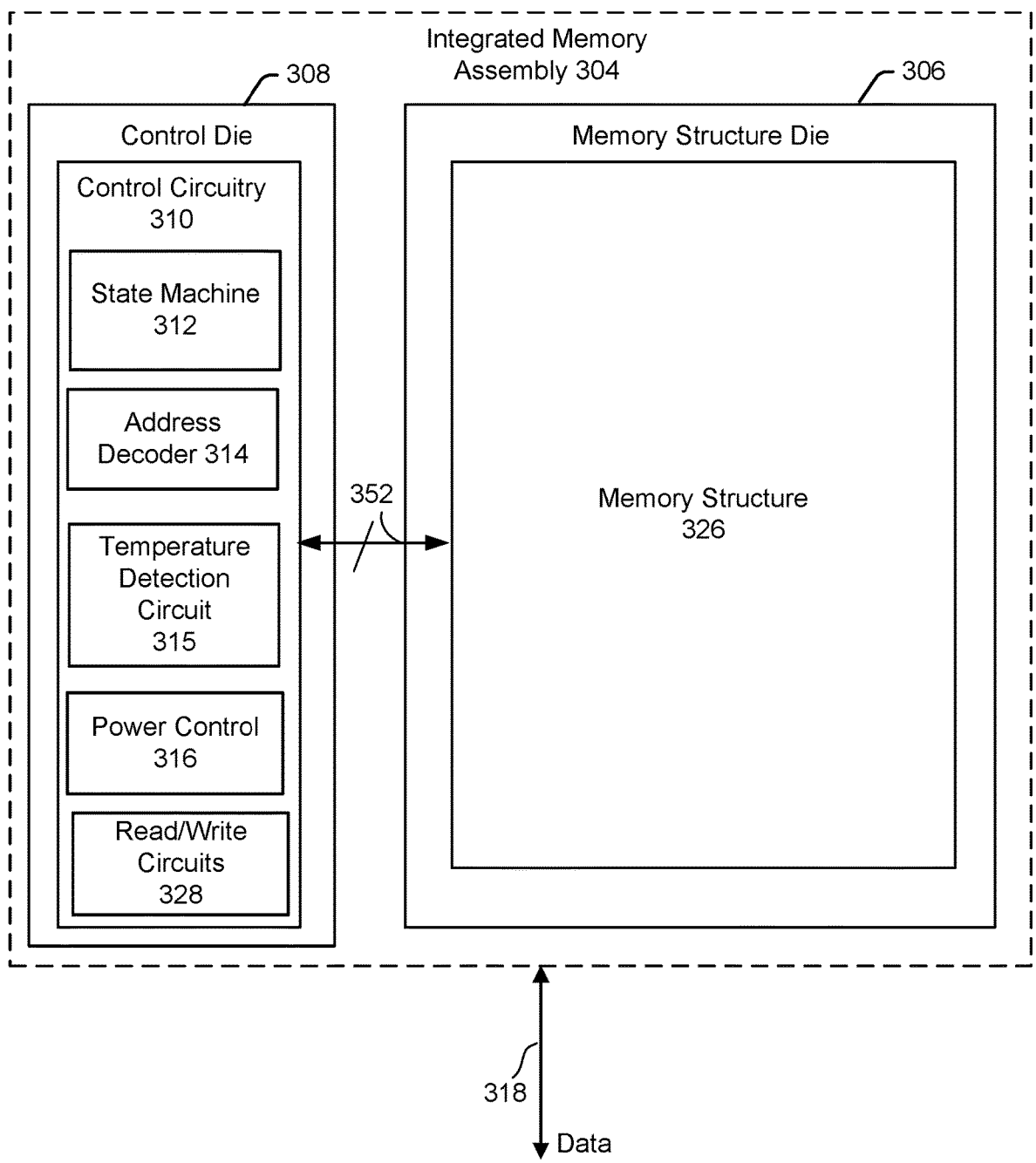
FIG. 2B is a block diagram of one embodiment of an integrated memory assembly.

FIG. 2B depicts a functional block diagram of one embodiment of an integrated memory assembly 304. The integrated memory assembly 304 may be used in a memory package 104 in memory system 100. In one embodiment, the integrated memory assembly 304 includes two types of semiconductor die (or more succinctly, "die"). Memory structure die 306 includes include memory structure 326. Memory structure 326 may contain non-volatile memory cells. Control die 308 includes control circuitry 310. In some embodiments, the memory die 306 and the control die 308 are bonded together. The control circuitry includes state machine 312, an address decoder 314, a power control circuit 316, and temperature detection circuit 315. The control circuitry also includes read/write circuits 328. In another embodiment, a portion of the read/write circuits 328 are located on control die 308, and a portion of the read/write circuits 328 are located on memory die 306.

Any subset of components in the control circuitry 310 can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory die 306. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 304 includes a set of input and/or output (I/O) pins that connect to communication channel 318 (also refers to herein as a data bus). Communication channel 318 is depicted as being connected to integrated memory assembly 304 for generality. Communication channel 318 may connect to either or both of die 306 and/or 308. In one embodiment, communication channel 318 connect the memory controller 102 directly to control die 308.

Figure 3:
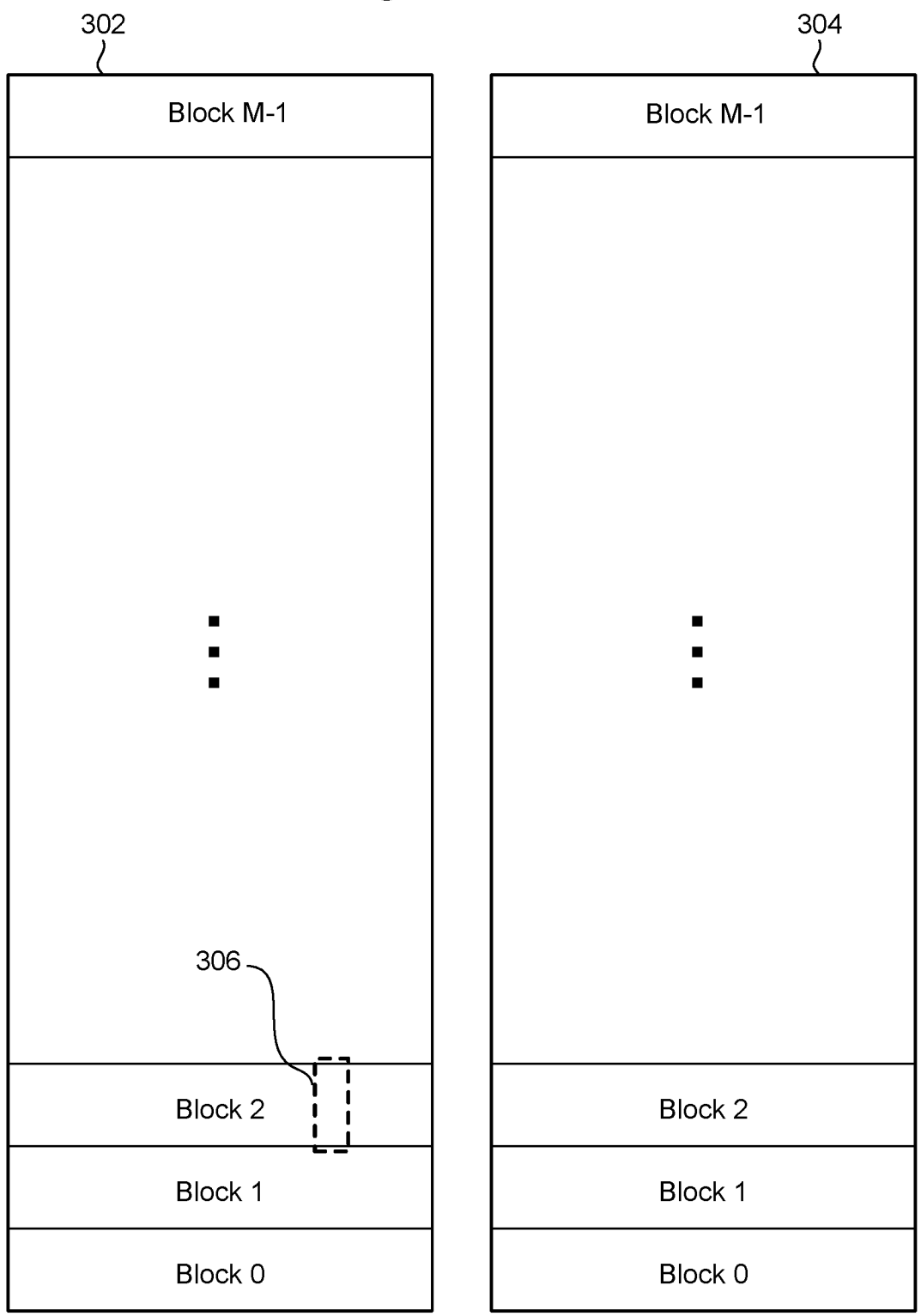
FIG. 3 is a block diagram that depicts details of a non-volatile memory structure.

FIG. 3 is a block diagram explaining one example organization of memory structure 326, which is divided into two planes 302 and 304. Each plane is then divided into M blocks. In one example, each plane has about 2000 blocks. However, different numbers of blocks and planes can also be used. A portion 306 of Block 2 is depicted in FIG. 4A.

Each memory erase block and/or each memory unit is typically divided into a number of pages. In one embodiment, a page is a unit of programming and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the page. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

Figure 4A:
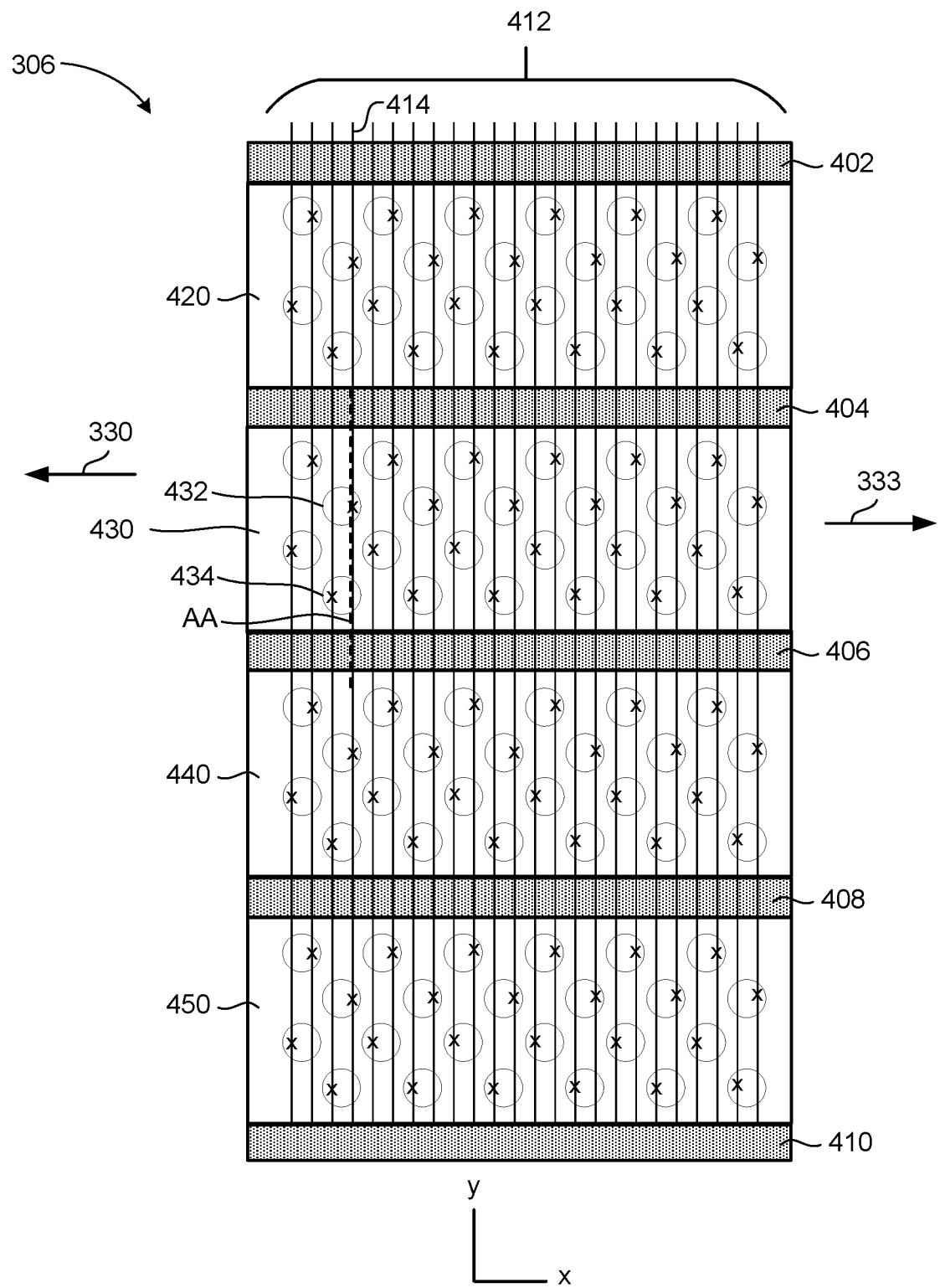
FIG. 4A is a block diagram depicting a top view of a portion of one block of memory structure.

FIG. 4A is a block diagram depicting a top view of a portion of one block of memory structure 326. The portion of the block depicted in FIG. 4A corresponds to portion 306 in block 2 of FIG. 3. As can be seen from FIG. 4A, the block depicted in FIG. 4A extends in the direction of arrow 330 and in the direction of arrow 333. In one embodiment, the memory array will have 48 layers. Other embodiments have less than or more than 48 layers. However, FIG. 4A only shows the top layer.

FIG. 4A depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4A extends in the direction of arrow 330 and in the direction of arrow 333, the block includes more vertical columns than depicted in FIG. 4A.

FIG. 4A also depicts a set of bit lines 412. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4A includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4A is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the managing circuit uses the source side select lines and the drain side select lines to choose one (or another subset) of the four to be subjected to a memory operation (program, verify, read, and/or erase).

Although FIG. 4A shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4A also shows the vertical columns being staggered. In other embodiments, different patterns of staggering can be used. In some embodiments, the vertical columns are not staggered.

Figure 4B:
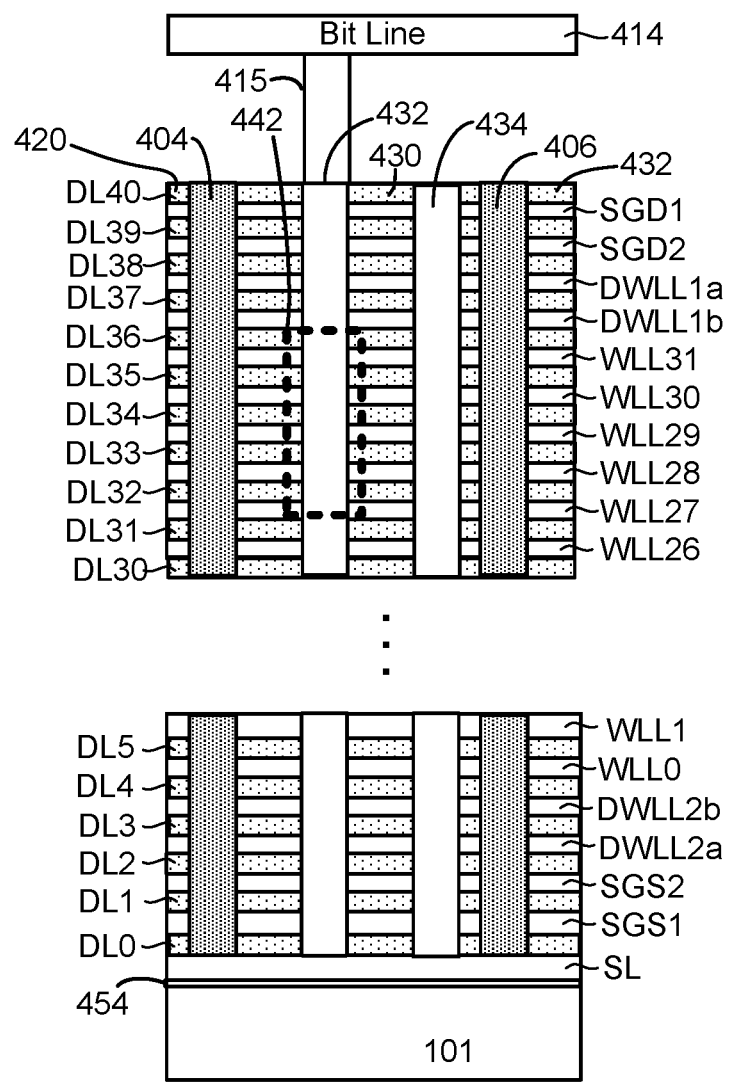
FIG. 4B depicts a portion of an embodiment of three dimensional memory structure showing a cross-sectional view along line AA of FIG. 4A.

FIG. 4B depicts a portion of an embodiment of three dimensional memory structure 326 showing a cross-sectional view along line AA of FIG. 4A. This cross sectional view cuts through vertical columns 432 and 434 and region 430 (see FIG. 4A). The structure of FIG. 4B includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Oher embodiments can implement more or fewer than two drain side select layers, more or fewer than two source side select layers, more or less than four dummy word line layers, and more or fewer than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4A, FIG. 4B show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL40. For example, dielectric layers DL31 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4C depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4A, local interconnects 402, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4D:
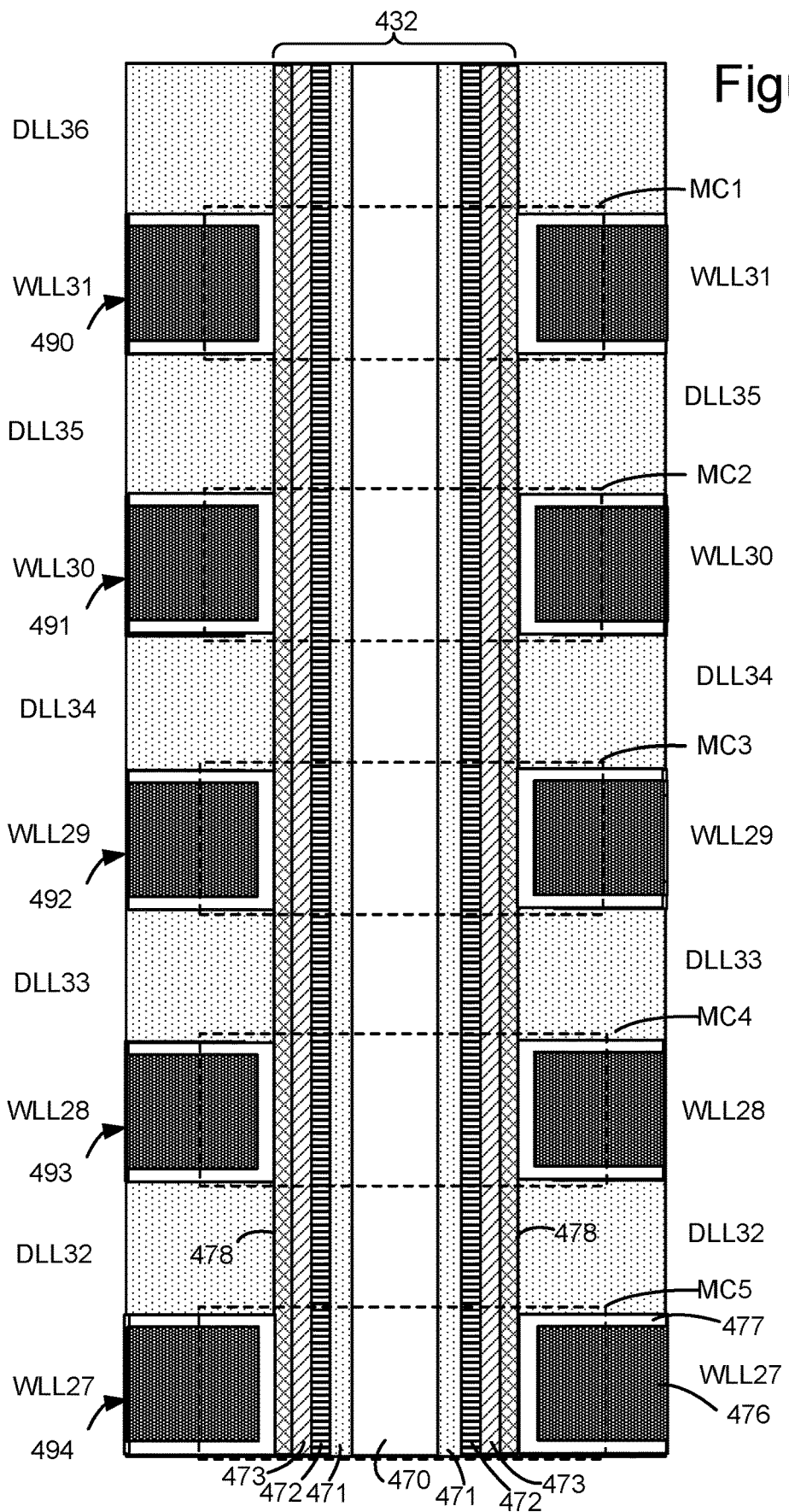
FIG. 4D depicts a cross sectional view of region 442 of FIG. 4B that includes a portion of vertical column 432.

FIG. 4D depicts a cross sectional view of region 442 of FIG. 4B that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4D depicts dielectric layers DLL32, DLL33, DLL34, DLL35 and DLL36, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (VT) of a memory cell is increased in proportion to the amount of stored charge. During an erase operation, the electrons return to the channel.

The memory systems discussed herein can be erased, programmed and read. At the end of a successful programming process (with verification), the threshold voltages of the memory cells should be within one or more distributions (ranges) of threshold voltages for programmed memory cells or within a distribution (range) of threshold voltages for erased memory cells, as appropriate. FIG. 5A illustrates example threshold voltage distributions (ranges) for MLC memory cells that store three bits of data. Other embodiments, however, may use other data capacities per memory cell (e.g., such as one, two, four, or five bits of data per memory cell). FIG. 5A shows eight threshold voltage distributions, corresponding to eight data states. The first threshold voltage distribution (data state) Erase-State represents memory cells that are erased. The other seven threshold voltage distributions (data states) A, B, C, D, E, F, G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 5A also shows seven read reference voltages (also referred to as read compare voltages) VrA, VrB, VrC, VrD, VrE, VrF, and VrG, for reading data from memory cells. By testing (e.g., performing sense operations) whether the threshold voltage of a given memory cell is above or below the seven read reference voltages, the system can determine what data state (i.e., Erase, A, B, C, ... ) a memory cell is in. These read reference voltages are used to read memory cells that store three bits per memory cell.

FIG. 5A also shows seven verify reference voltages (also referred to as program verify targets) VvA, VvB, VvC, VvD, VvE, VvF, and VvG. When programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG.

The amount of the charge in the individual charge storage regions might not stay fixed over time. One possible effect is for charges to leak from the charge storage regions over time. A heating event, such as IR reflow, could cause also a substantial charge loss. Also note that a memory system could be subject to multiple IR reflows. For example, two sides of the memory device could be soldered during two separate IR reflow processes. Also, one of the IR reflow processes might be repeated. The charge loss (e.g., data retention) of the IR reflow processes could be the equivalent of many years charge loss at normal temperatures.

FIG. 5B shows $V_T$ distributions illustrating charge loss for memory cells in the A-state through the G-state. The dashed $V_T$ distributions represent the $V_T$ distributions for the A-state through the G-state immediately after programming. The solid lines represent the shift to the $V_T$ distributions for the A-state through the G-state. In this example, the shift lowers the $V_T$ distributions for the A-state through the G-state. In this example, the lower tail is shifted downward (e.g., has a lower $V_T$). However, the upper tail remains about the same, in this example.

Note that some of the memory cells in the shifted distributions in FIG. 5B have a $V_T$ that is below the read reference level for their $V_T$ distribution. For example, a small portion of the $V_T$ distribution for the A-state is below VrA. This will result in some A-state memory cells being read as being in the erased state, which is referred to as a fail bit. Similar analysis applies to other data states. The ECC engine 226/256 is able to correct errors and successfully read the data, providing that the fail bit count is not too high. However, the time it takes to read may be substantially increased. In some applications, a large amount of data is pre-loaded into the memory system 100. Moreover, this pre-loaded data may be stored at multiple bits per memory cell to provide for a large amount of pre-loaded data. Embodiments of memory system 100 are able to efficiently and accurately read the pre-loaded data following a heating event such as an IR reflow.

In some embodiments, the memory system 100 determines new read reference levels, which reduces the fail bit count. Determining new read reference levels is also referred to as calibrating the read reference levels. FIG. 5B shows read reference voltages VrA', VrB', VrC', VrD', VrE', VrF', and VrG'. These are newly determined voltages for reading the memory cells instead of the former read reference voltages VrA, VrB, VrC, VrD, VrE, VrF, and VrG. Note that VrA', VrB', VrC', VrD', VrE', VrF', and VrG' will have lower fail bit counts for the shifted distributions than if VrA, VrB, VrC, VrD, VrE, VrF, and VrG were used. In some embodiments, the memory system 100 determines the new read reference levels after a heating event such as an IR reflow. One challenge in determining the new read reference levels is that the IR reflow (or other heating event) typically causes a substantial charge loss, and hence a substantial shift in the threshold voltage distributions. Moreover, determining the new read reference levels after a heating event can be challenging due to instability of one or more conditions in the memory structure 326. As will be discussed in more detail below, memory cell threshold voltages may be unstable, which can make it very challenging to properly calibrate the new read threshold voltages. Embodiments of a memory system stabilize one or more conditions of a memory structure after a heating event, prior to determining new read reference levels. In one embodiment, the memory system stabilizes the threshold voltages of the memory cells. In one embodiment, the memory system stabilizes voltages of word lines connected to the memory cells. In one embodiment, the memory system performs a dummy read to stabilize one or more conditions in the memory structure. Thus, the memory system is able to accurately determine the new read reference levels.

Figure 5C:
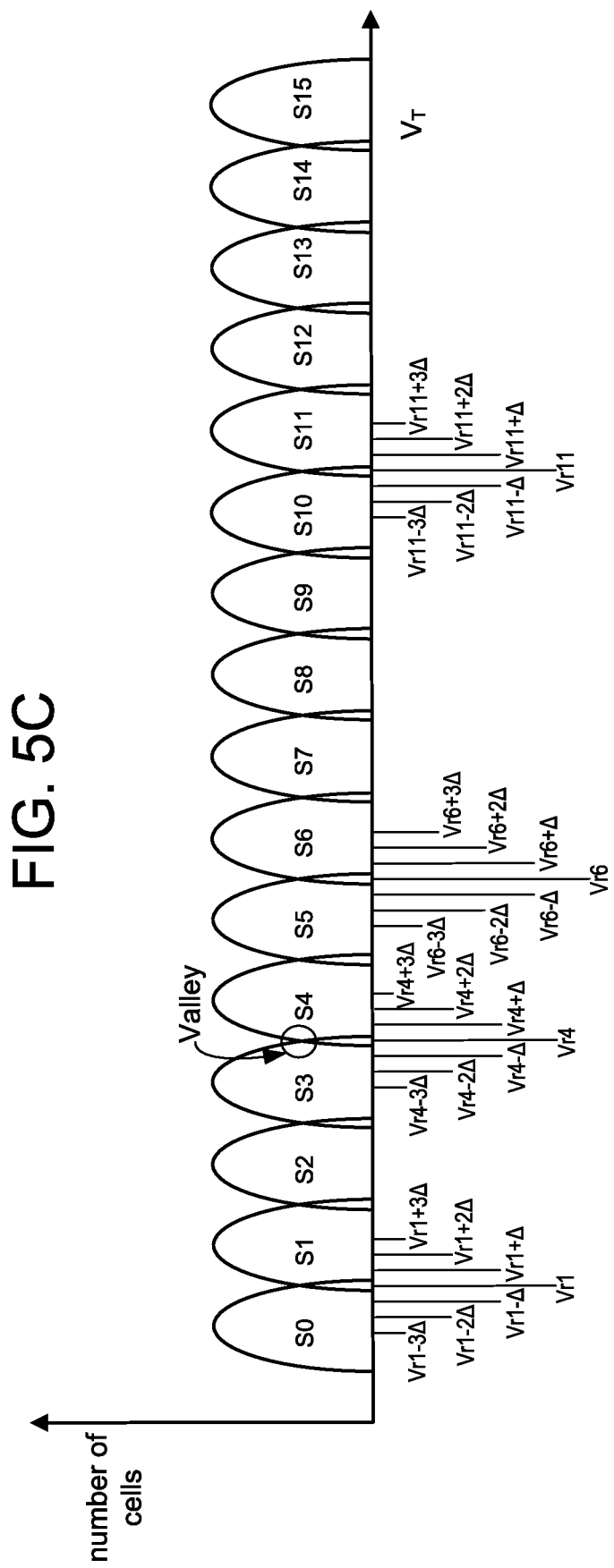
FIG. 5C depicts threshold voltage distributions when each memory cell stores four bits of data.

FIG. 5C depicts threshold voltage distributions when each memory cell stores four bits of data. FIG. 5C depicts that there may be some overlap between the data states S0-S15. The overlap may occur due to factors such as memory cells losing charge (and hence dropping in threshold voltage). Over time, the locations of the threshold voltage distributions may change. Also, a heating event such as an IR reflow can shift the threshold voltage distributions. Such changes can increase the bit error rate, thereby increasing decoding time or even making decoding impossible. Calibrating the read reference voltages can help to mitigate such effects.

As noted, FIG. 12B depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11. In some embodiments, the read reference voltages that are used to read a page are adjusted from time to time.

Thus, memory cells have a limited ability to retain charge over time, which may be referred to as a "data retention" issue. Typically, memory cells will lose charge very slowly over a long period of time. When a memory device is subjected to a heating event, such as IR reflow, the memory cells could suffer a significant charge loss. Note that some time may pass between device manufacture and the heating event (e.g., IR reflow). Thus, both the data retention issue and the heating event could cause memory cell charge loss, resulting in a shift of a $V_T$ distribution of a group of memory cells.

Another issue that occurs in some non-volatile memory systems is that the $V_T$ of a memory cell can vary depending on when the read operation occurs. Stated another way the $V_T$ of a memory cell can vary depending on a condition of the memory structure, such as word line voltages prior to the read. For example, the $V_T$ can vary in the memory cells depending on a coupled up state of the word lines when the read operation occurs. As noted above, a "first read" situation can be defined in which the word lines are not coupled up, and a "second read" situation can be defined in which the word lines are coupled up.

The memory cells can be in the first read situation after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. The cells can also be in the first read situation after a significant amount of time has passed after a last sensing operation, since the word lines discharge over time. Since the word lines are not significantly coupled up while in the first read situation, this $V_T$ shift does not occur.

The cells can be in the second read situation when the read occurs shortly, e.g., seconds or minutes, after a last sensing operation. Since the word lines are relatively strongly coupled up while in the second read situation, there is a programming or erasing of the cells due to the word line voltage, and a corresponding shift in the $V_T$h. In particular, the word lines with a coupled-up voltage can cause weak programming of cells which have a relatively low $V_T$, lower than the coupled-up voltage, e.g., cells in lower programmed data states, thus resulting in a $V_T$ upshift for these cells. Also, there can be a weak erasing of cells which have a relatively high $V_T$, higher than the coupled-up voltage, e.g., cells in higher programmed data states, thus resulting in a $V_T$ downshift for these cells. The cells gradually transition from the second read situation to the first read situation over time, e.g., one hour, as the word lines are discharged.

The coupling up of the word line voltage is caused by the voltages of a sensing operation such as a verify operation which occurs in connection with a programming operation, or a read operation of already programmed memory cells. The sensing of the memory cells involves the application of a sensing voltage (e.g., a read/verify voltage) to a selected word line. At the same time, a dummy read voltage is applied to the unselected word lines and then stepped down. This step down temporarily reduces a channel voltage due to capacitive coupling. When the channel voltage increases back to its nominal level, this causes an increase or coupling up of the word line voltages, also due to capacitive coupling. For cells in the lower data states, the $V_T$h gradually decreases as electrons which are trapped in the charge trapping material of the cells are de-trapped and return to the channel. For cells in the higher data states, the $V_T$h gradually increases as electrons are removed from the channel.

FIGS. 6A and 6B will be referred to describe the coupling up of word line voltages that is associated with the first read versus second read phenomena. FIG. 6A depicts a plot of example waveforms in a read operation, where a read pass voltage (Vread) is applied to unselected word lines with read voltages for different pages are applied to the selected word line. A read operation is similar to a verify operation as both are sensing operations and both can provide a coupling up of the word line voltages. The horizontal axis depicts time and the vertical axis depicts word line voltage, Vwl. A pass voltage 610 is applied to the unselected word lines from t0-t11 and reaches a magnitude of Vread. The pass voltage includes an increasing portion 610a, a portion 610b at Vread and a decreasing portion 610c. A read voltage includes a separate waveform 612 (at levels of VrA2 and VrE1), 614 (at levels of VrB2, VrD2 and VrF1) and 616 (at levels of VrC2 and VrG1) for each of the lower, middle and upper pages, respectively, consistent with FIGS. 5A and 5B. The read voltages are applied to the selected word line. An eight-level memory device is used in this example.

After applying VrA2, the memory cells are sensed at time t2. After applying VrE1 is applied, the memory cells are sensed at time t3. After applying VrB2, the memory cells are sensed at time t4. After applying VrD2, the memory cells are sensed at time t5. After applying VrF1, the memory cells are sensed at time t6. After applying hen VrC, the memory cells are sensed at time at t7. After applying VrG1, the memory cells are sensed at time t8.

For the unselected word lines, the decrease in Vread will cause the cells to transition from a conductive state to a non-conductive state. The dotted line at t10 indicates when a cell with $V_T$h=VvG becomes non-conductive. As the pass voltage 610 decreases from VvG to 0 V, the channel is capacitively coupled down by a similar amount, as represented by a dashed line 620*a* in FIG. 6B.

FIG. 6B depicts a plot of a channel voltage (Vch) corresponding to FIG. 6A. The channel is capacitively coupled down to a minimum level of Vch_min from t10-t11 and then begins to return to its original, starting level of, e.g., 0 V from t11-t12. If the voltages of the word lines are allowed to float starting at t11, the voltages (plot 622) are capacitively coupled higher by the increase in Vch (plot 620*b*). The voltages of the word lines float to a peak level of Vwl_coupled_up.

Figure 7:
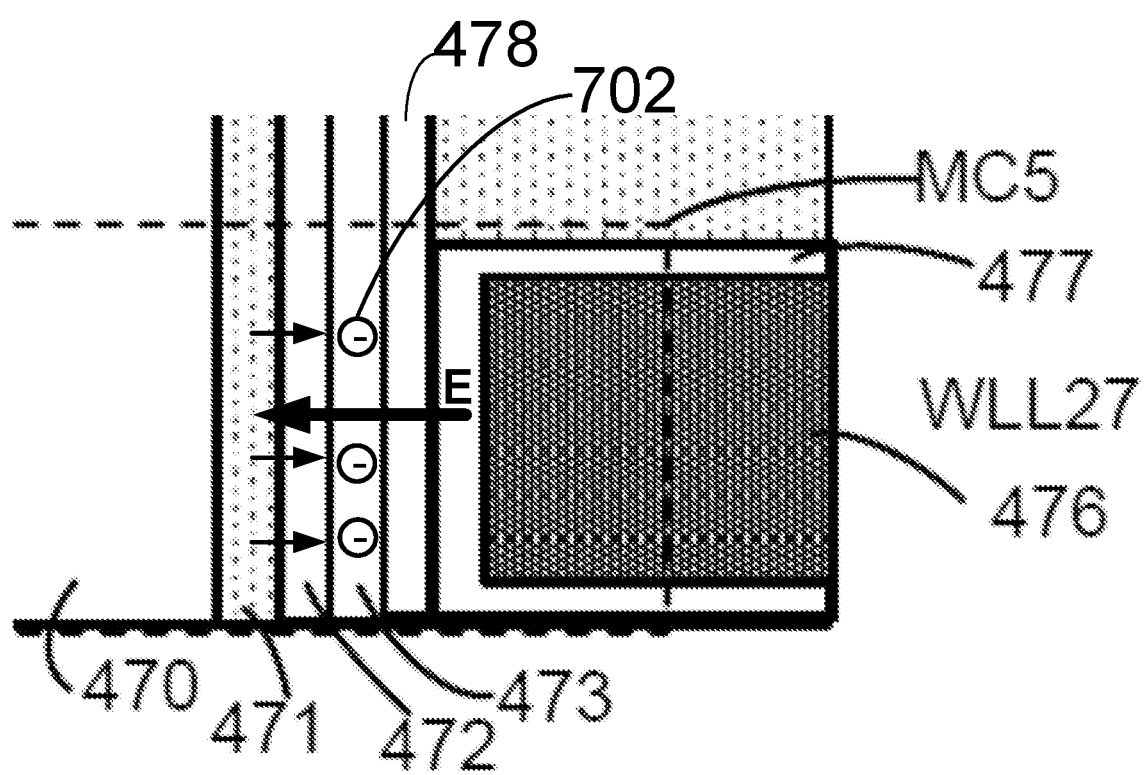
FIG. 7 depicts a portion of a memory cell MC5 of FIG. 4D showing electron injection into a charge trapping region, as a result of a coupled up voltage on a word line.

During the sensing operation, various memory cells on the string may be in a conductive state. Hence, there may be electrons in the channel. As depicted in FIG. 6A, after sensing the selected memory cell, the control gate voltages may be discharged from the read pass voltage down to a steady state voltage (e.g., Vss). During this discharge, it is possible for some of the electrons to remain in some portions of the channel. As depicted in FIG. 6A, after the control gates have been discharged to the steady state voltage, the word lines (or control gates) may be floated. As depicted in FIGS. 6A and 6B, it is possible for capacitive coupling between the channel and the control gates to cause the voltage on the control gates to creep up after the sensing operation. The voltage difference between the control gate and channel results in an electric field (E field), as depicted in FIG. 7. FIG. 7 depicts a portion of a memory cell MC5 of FIG. 4D showing electron injection into a charge trapping region, as a result of a coupled up voltage on a word line. FIG. 7 depicts what may be referred to as a weak programming of the memory cell MC5. The memory cell includes a control gate 476, an aluminum oxide layer 477, a blocking oxide (SiO$_2$) layer 478, a charge trapping layer 473, a tunneling layer 472, a channel 471 and a dielectric core 470. Due to the coupled up word line voltage, an electric field (E) is created which attracts electrons (see example electron 702) into the charge trapping layer 473, increasing the V$_T$. The electrons may be residual electrons that remain in the channel 471 after the read operation. Such residual electrons may be trapped in shallow interface traps in the charge trapping region 473. This weak programming may be caused by the Poole-Frenkel effect, in which an electrical insulator can conduct electricity. This is a kind of electron tunneling through traps.

In some cases, a memory cell may incur a weak erase as a result of the coupling up of the word lines. A weak erase could happen to a memory cell with a high threshold voltage (such as the G-state). Similar to a weak program, a weak erase involves an electric field. However, for a weak erase the electric field would be in the opposite direction than is depicted in FIG. 7. For a weak erase, the electric field repels electrons from the charge trapping layer, decreasing the V$_T$.

After a sufficient amount of time, the control gate voltage may drop back down to the steady state voltage (e.g., Vss). The residual electrons that were trapped in the shallow interface traps may then become de-trapped. Therefore, the threshold voltage of the memory cell may return to the former level. However, it may take considerable time (e.g., 20 minutes to an hour) for the voltage to settle down and the electrons to de-trap.

Note that any of the memory cells on the NAND string having a memory cell that was sensed could potentially have its threshold voltage impacted by the word line voltage creep up problem. Thus, word line voltage creep up can impact sensing the same memory cell again, or sensing a different memory cell on the NAND string.

Thus, one challenge in calibrating read reference levels is that the IR reflow (or other heating event) typically causes a substantial charge loss, and hence a substantial shift in the threshold voltage distributions. Moreover, calibrating the read reference levels after a heating event can be challenging due to instability of one or more conditions in the memory structure 326. As discussed in connection with FIG. 7, the memory cell V$_T$ may be unstable, which can make it very challenging to properly calibrate the new read threshold voltages. Embodiments of a memory system stabilize one or more conditions of a memory structure after a heating event, prior to calibrating the read reference levels. In one embodiment, the memory system stabilizes the threshold voltages of the memory cells. In one embodiment, the memory system stabilizes the threshold voltages of the memory cells by deliberately causing the condition in which the residual electrons 702 are trapped in the charge trapping region 473 for at least some memory cells. In one embodiment, the memory system stabilizes voltages of word lines connected to the memory cells. In one embodiment, the memory system deliberately creates a coupled up voltage (see FIG. 6A) in order to stabilize voltages of word lines. In one embodiment, the memory system performs a dummy read to stabilize one or more conditions in the memory structure. In one embodiment, the dummy read causes the word line voltages to couple up, which may stabilize V$_T$s. Thus, the memory system is able to accurately calibrate the read reference levels.

Figure 8:
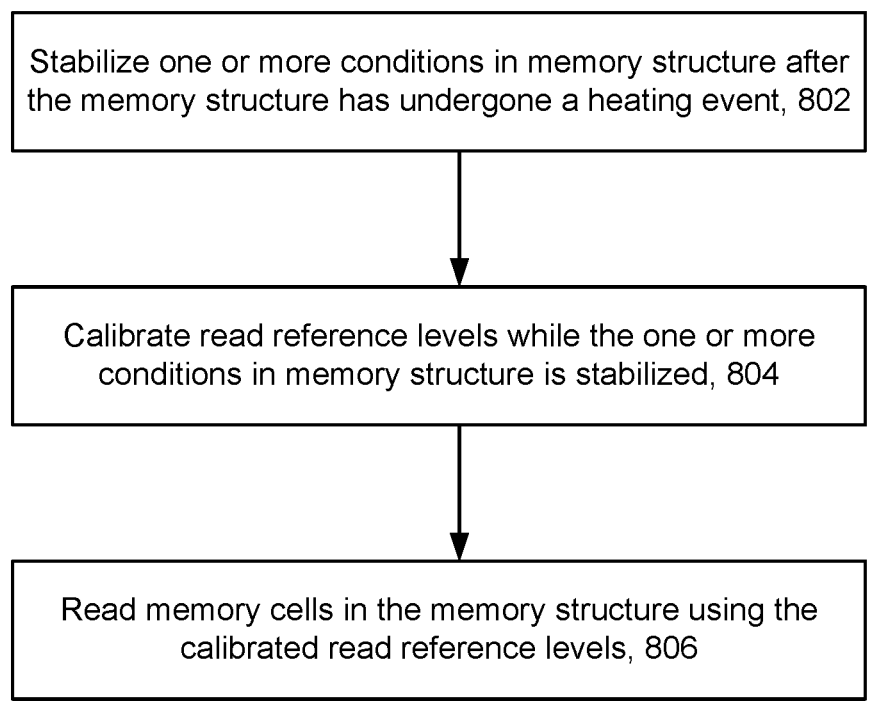
FIG. 8 depicts a flowchart of one embodiment of process of operating a non-volatile memory system.

FIG. 8 depicts a flowchart of one embodiment of process 800 of operating a non-volatile memory system. The memory system may be pre-loaded with data, with non-volatile memory cells store the data at multiple bits per memory cell. For example, the data may be stored at two bit per memory cell, three bits per memory cell, four bits per memory cell, etc. Process 800 calibrates read reference levels following a heating event, such as an IR reflow. In process 800, one or more conditions of the memory structure are stabilized following the IR reflow. The read reference levels are calibrated while the one or more conditions are stabilized. Hence, the memory system 100 is able to accurately calibrate the read reference levels. In one embodiment, process 800 is performed by memory system 100. In one embodiment, process 800 is performed by control circuitry 310 on memory die 300. In one embodiment, process 800 is performed by control circuitry 310 on control die 308.

Step 802 includes stabilizing one or more conditions in the memory structure 326. Step 802 is performed after the memory structure 326 has undergone a heating event, such as an IR reflow. The heating event has an impact on the memory structure 326, such as causing charge loss in non-volatile memory cells. In one embodiment, step 802 is performed in response to detecting that a heating event has occurred. In one embodiment, the heating event is an IR reflow. Note that considerable time may pass between the occurrence of the heating event and step 802.

In one embodiment, stabilizing the one or more conditions includes stabilizing threshold voltages of non-volatile memory cells in the memory structure 326. Stabilizing the V$_T$s means that the V$_T$s will be stable from one sensing operation to the next, over a period of time in which the read reference levels are calibrated (see step 804). There may be some very small amount of variance in the V$_T$s, but the variance will be much less than the variance associated with, for example, the first read and second read conditions discussed herein.

In one embodiment, stabilizing the conditions includes stabilizing voltages of word lines connected to the non-volatile memory cells. In one embodiment, word line voltages are placed into a coupled up state, such as in FIG. 6A. If the word line voltages are in the coupled up state each time a sensing operation is performed when the read reference levels are calibrated, then the read reference levels can be quickly and accurately calibrated.

In one embodiment, a dummy read is performed in step 802. In one embodiment, a dummy read includes applying a dummy read voltage (e.g., Vdummy) to all memory cells on a NAND string. In one embodiment, a dummy read includes applying a dummy read voltage to all word lines in a block of memory cells.

Step 804 includes calibrating the read reference levels while the one or more conditions in the memory structure 326 is/are stabilized. In an embodiment, calibrating the read reference levels includes sensing the memory cells while the one or more conditions in the memory structure 326 is/are stabilized. Calibrating the read reference levels could include many sensing operations. In one embodiment, the memory system 100 performs a scan for a valley between two threshold voltage distributions. The new read reference voltage may be at the valley. The valley refers to the location between two adjacent threshold voltage distributions that has a minimum number of memory cells. For example, FIG. 5C shows a valley between data state S3 and data state S4. In one embodiment, the new read reference voltage is established at the valley.

The valley scan includes reading a various levels near the present read reference voltage. For example, with respect to FIG. 5C, the valley scan could read successively at [Vr4−3Δ, Vr4−2Δ, Vr4−Δ, Vr4, Vr4+Δ, Vr4+2Δ, Vr4+3Δ]. With each new read, the number of memory cells whose state "flips" can be counted. In other words, a count is made of the number of memory cells that transition from not conducting (i.e., having a threshold voltage above the read reference voltage) to conducting (i.e., having a threshold voltage below the read reference voltage). In one embodiment, the valley is selected based on the location having the fewest such transitions. For example, the new read reference voltage can be selected as the read reference voltage that had the fewest such transitions. Other techniques may be used to perform a valley scan.

In one embodiment of step 804, the memory system 100 establishes new read reference levels in locations that reduce or minimize a bit error rate (BER). For example, the memory system 100 senses memory cells using different sets of read reference voltages, and then determining an error metric such as a BER for each set of read reference voltages. The new read reference levels are then established as the set of read reference voltages that have the lowest BER.

Many other techniques can be used to calibrate the read reference voltages other than the aforementioned valley scan and reduction of BER. Because the one or more conditions in the memory structure 326 is/are stabilized during step 804, the sensing of the memory cells is accurate. For example, by stabilizing threshold voltages of the memory cells, sensing is accurate. Therefore, the new read reference levels may be accurately determined. If the threshold voltages of the memory cells were not stabilized, then it may be difficult or impossible to calibrate the read reference levels.

Step 806 includes reading non-volatile memory cells in the memory structure 326 using the calibrated read reference levels. Step 806 includes reading the memory cells at multiple bits per memory cell.

Figure 9:
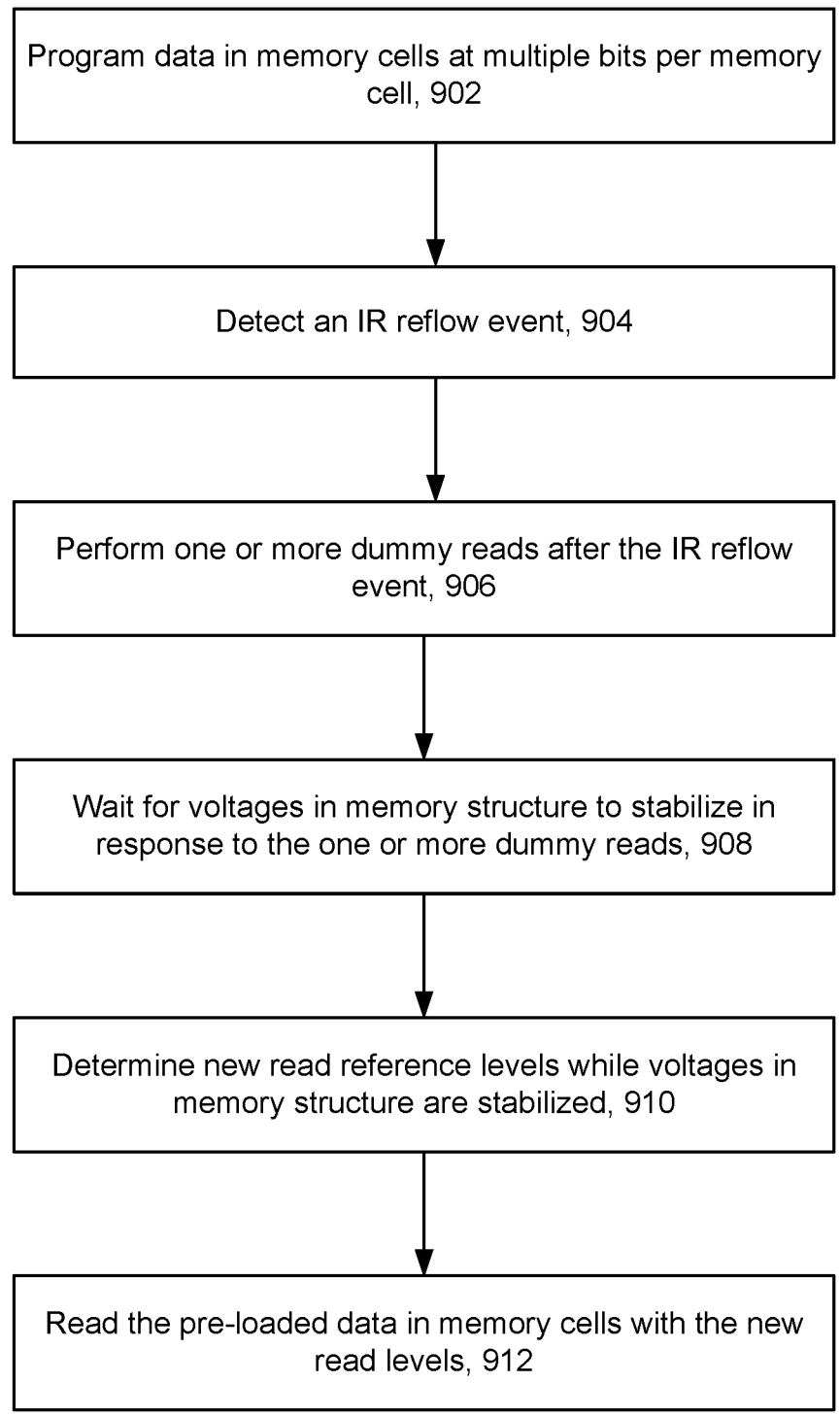
FIG. 9 depicts a flowchart of one embodiment of a process of calibrating read reference levels after an IR reflow event.

FIG. 9 depicts a flowchart of one embodiment of a process 900 of calibrating read reference levels after an IR reflow event. Process 900 describes further details of one embodiment of process 800. In one embodiment, process 900 is performed by memory system 100. In one embodiment, process 900 is performed by control circuitry 310 on memory die 300. In one embodiment, process 900 is performed by control circuitry 310 on control die 308.

Step 902 includes programming data in non-volatile memory cells in the memory structure 326 at multiple bits per memory cell. In one embodiment, the data is stored at two bits per memory cell. In one embodiment, the data is stored at three bits per memory cell. In one embodiment, the data is stored at four bits per memory cell. The data could be stored at more than four bits per memory cell. This data is stored prior to the IR reflow event that is detected (see step 904). Therefore, the data is referred to as pre-loaded data.

Step 904 includes detecting the aforementioned IR reflow event. Note that the pre-loaded data is still stored in the memory cells when the IR reflow event occurs. Also note that the IR reflow event is detected by the memory system 100, in step 904. The memory system 100 detecting the IR reflow is referred to herein as "self-detecting" an IR reflow. Numerous techniques may be used to self-detect an IR reflow event. In one embodiment, a block of memory cells are put through a number of program/erase cycles. A group of the memory cells in the cycled block are programmed to a reference $V_T$ distribution. The memory system 100 self-detects that there has been an IR reflow in response to a shift in the reference $V_T$ distribution being more than an allowed amount. Further details of self-detecting an IR reflow are described in U.S. Pat. No. 9,704,595, titled "Self-Detecting a Heating Event to Non-Volatile Storage," which is hereby incorporated by reference. Although the memory system 100 may perform self-detecting of an IR reflow event, as discussed above, it is understood that IR reflow events occur during device assembly, so once a device is assembled, the following steps may be initiated as part of a device set-up or testing routine performed at the factory after assembly.

Figure 11:
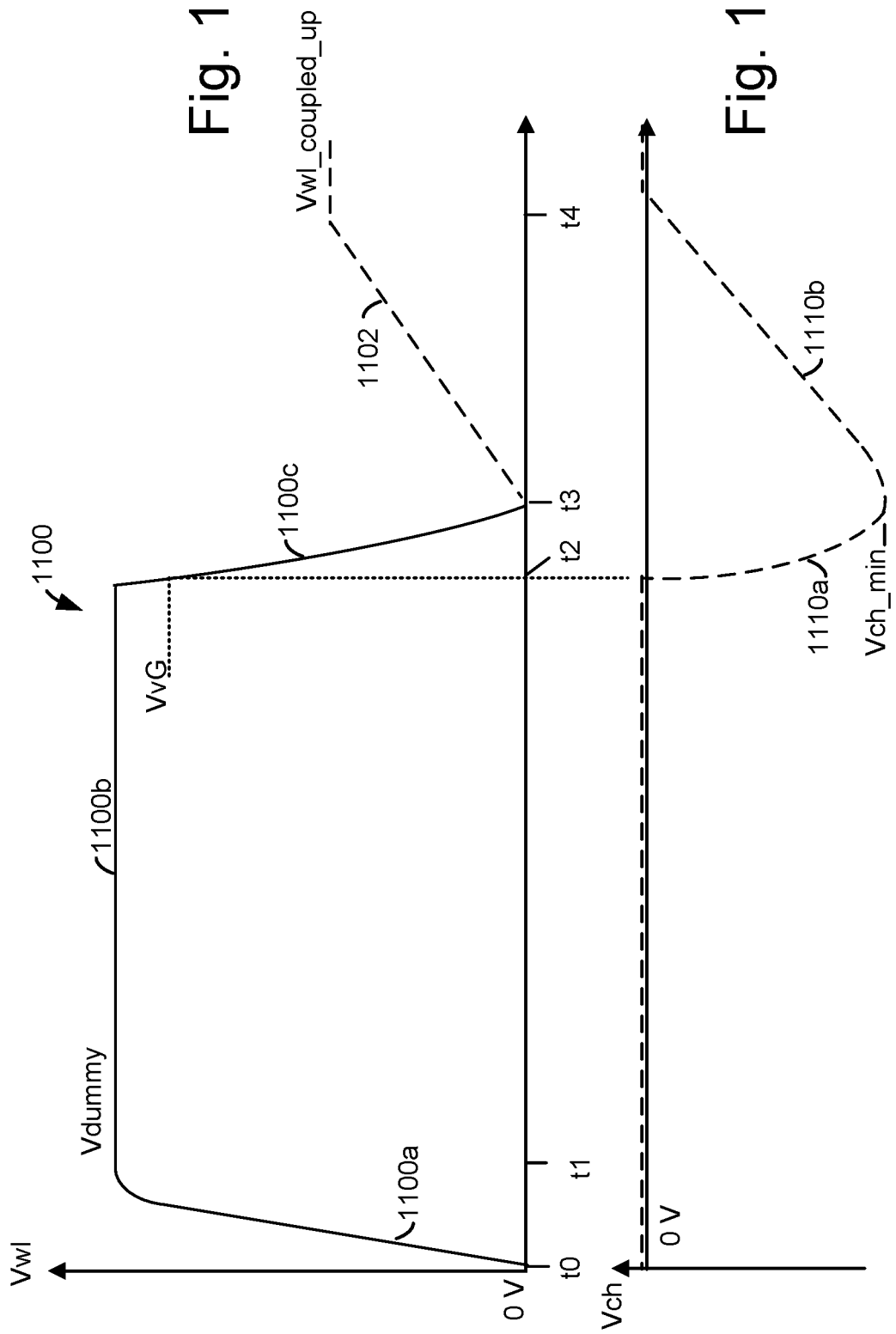
FIG. 11A depicts a plot of an example dummy read voltage applied to a word line and a subsequent coupled up voltage of the word line.
FIG. 11B depicts a plot of a channel voltage corresponding to FIG. 11A.

Step 906 includes performing one or more dummy reads after the IR reflow event. In one embodiment, dummy read voltages are applied to all memory cells on a NAND string during a dummy read. In one embodiment, all blocks in the memory structure receive a dummy read. For example, each dummy read could target $\frac{1}{8}^{th}$ of the blocks in the memory structure 326. Further details of performing a dummy read are discussed below in connection with FIG. 11.

Step 908 is to wait for the word line voltages to stabilize after performing the one or more dummy reads. As discussed in connection with FIGS. 6A and 6B, the word line voltages couple up after a read operation. A similar effect happens after a dummy read, as will be discussed in more detail below in connection with FIGS. 10A and 10B. In one embodiment, waiting allows the word line voltages to couple up and stabilize at a coupled up magnitude. In one embodiment, the memory system 100 waits a pre-determined amount of time for the word line voltages to stabilize. In one embodiment, the memory system 100 waits for about 100 milliseconds in step 908.

Step 910 includes determining new read reference voltages while the word line voltages are stabilized. The read reference voltages are for reading the memory cells at however many bits the data was pre-loaded in step 902. Thus, the new read reference voltages are for reading the data that was pre-loaded in step 902. Step 910 may include sensing the memory cells at various voltage levels.

Step 912 includes reading the pre-loaded data in the memory cells with the new read reference voltages.

Figure 10:
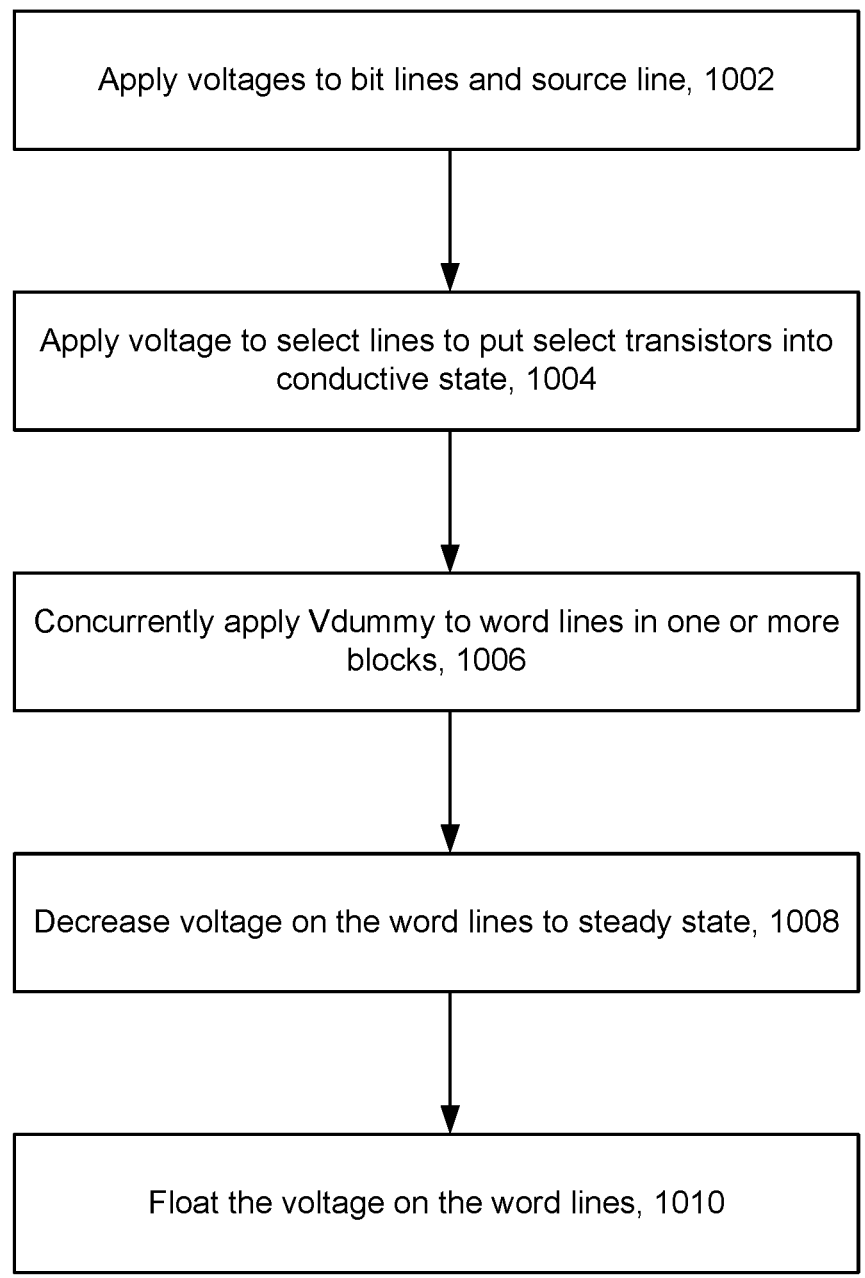
FIG. 10 depicts a flowchart of one embodiment of a process of performing a dummy read.

FIG. 10 depicts a flowchart of one embodiment of a process 1000 of performing a dummy read. The process 1000 may be used in step 906 of process 900. In one embodiment, process 1000 is performed by memory system 100. In one embodiment, process 1000 is performed by control circuitry 310 on memory die 300. In one embodiment, process 1000 is performed by control circuitry 310 on control die 308. In one embodiment, the dummy read is performed for all memory cells in a block of memory cells. The dummy read may be performed for multiple blocks of memory cells. In some embodiments, the memory cells are configured as NAND strings, such as vertically oriented NAND strings in three-dimensional memory array. Hence, the dummy read can be performed for all memory cells on one or more NAND strings.

Step 1002 includes applying voltages to bit lines and source line(s). In one embodiment, the bit lines and source line(s) are grounded.

Step 1004 includes applying voltages to select lines to put select transistors into a conductive state. In one embodiment, step 1004 puts both drain side select transistors and source side select transistors into a conductive state.

Step 1006 includes concurrently applying a dummy read voltage (Vdummy) to word lines in one or more blocks. One approach is to apply the dummy read voltage to all data word lines in a block concurrently. This can include data word lines but not dummy word lines, or both data word line and dummy word lines. Another approach is to apply dummy read voltages one after another to different sets of word lines in a block. Another approach is to apply the dummy read voltage to fewer than all data word lines in a block concurrently.

Step 1008 includes decreasing the voltage on the word lines from the dummy read voltage to a steady state voltage (e.g., Vss). In one embodiment, Vss is 0V. Step 1010 includes allowing the voltage on the word lines to float. As will be explained below in the discussion of FIGS. 11A and 11B, the dummy read process results in coupling up of word line voltages.

FIG. 11A depicts a plot of an example dummy read voltage applied to a word line and a subsequent coupled up voltage of the word line. The dummy read voltage triggers the coupling up of the word line voltage. In one embodiment, the magnitude of the dummy voltage is at least as high as a highest verify voltage of the different verify voltages used to program memory cells to different data states. For example, for a memory device with eight data states, Vdummy should be at least VvG. This ensures that the maximum coupling down of the channel and the maximum coupling up the word line voltage.

The horizontal axis depicts time and the vertical axis depicts word line voltage, Vwl. A dummy read voltage 1100 (e.g., a voltage pulse or waveform) is applied to the word lines in a block from t0-t3 and reaches a magnitude of Vdummy at t1. The dummy read voltage includes an increasing portion 1100a, a portion 1100b at Vdummy and a decreasing portion 1100c. The voltage drivers may be commanded to no longer provide a voltage at t3 (e.g., to disconnect the voltage drivers from the word lines) to allow the voltages to float.

A control circuit may be configured to command a voltage driver to increase voltages of the word lines from an initial level (e.g., 0 V) to an elevated level (e.g., Vdummy), and then to decrease the voltages of the word lines from the elevated level to a final level (e.g., 0 V). The control circuit, to float the voltages of the word lines, is configured to disconnect the voltage driver from the word lines at specified time (e.g., after time t3).

At t2, the voltage falls below VvG so that the memory cells in the G state are made non-conductive state. The remaining transition of the voltage provides capacitive coupling, as discussed in connection with FIGS. 6A and 6B. Memory cells in lower states are made non-conductive when the voltage falls lower. Different contributions to the coupling up of a word line can therefore be made by the different cells connected to the word line according to their respective data states. An overall coupled up voltage on the word line will be provided.

As the dummy voltage 1100 decreases from VvG to 0 V, the channel is capacitively coupled down by a similar amount, as represented by a dashed line 1110a in FIG. 11B.

FIG. 11B depicts a plot of a channel voltage which is coupled down from a starting level, e.g., 0 V, and subsequently returns to the starting level, consistent with FIG. 11A. The channel is capacitively coupled down to a minimum level of Vch_min and then begins (at t3) to return to its starting level (which is reached at t4). The voltages of the word lines are allowed to float starting at t3, so that the voltages (plot 1102) are capacitively coupled higher by the increase in Vch (plot 1110b). The voltages of the word lines float to a peak level of Vwl_coupled_up at t4.

Figure 12:
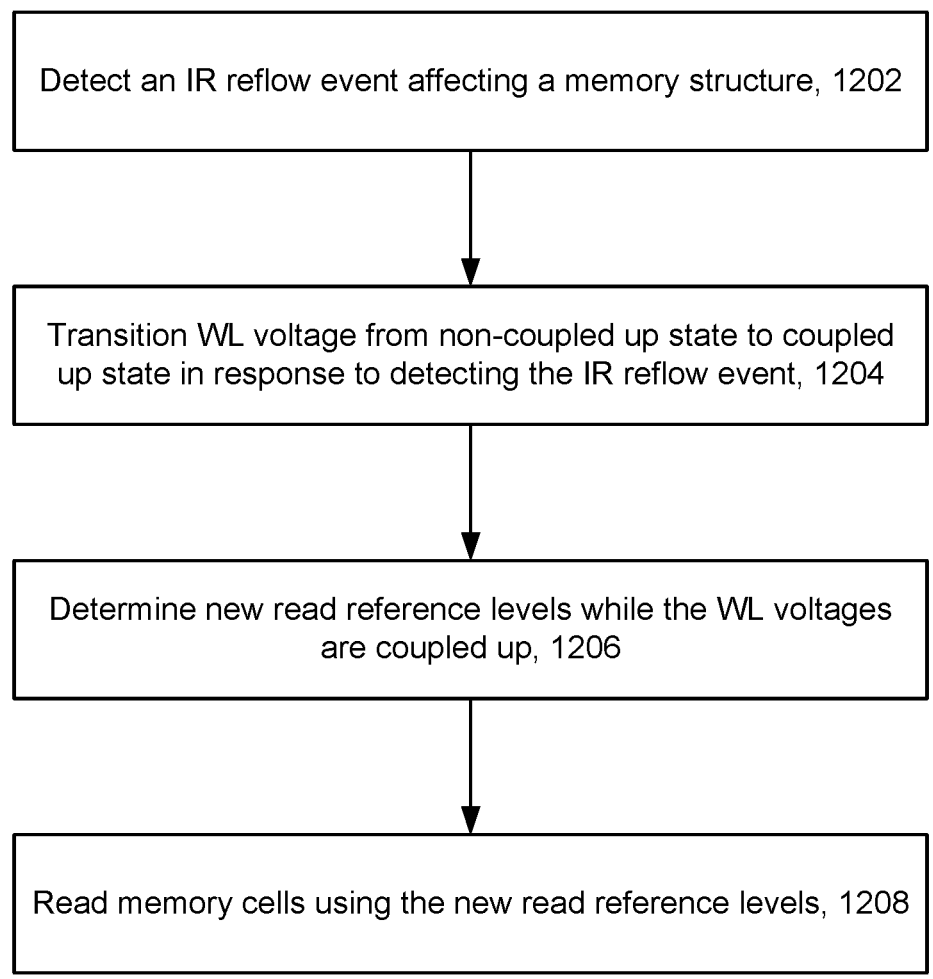
FIG. 12 depicts a flowchart of one embodiment of a process of calibrating read reference levels after an IR reflow in which word line voltages are stabilized.

In some embodiments, stabilizing a condition in the memory structure 326 includes stabilizing voltages on word lines. In one embodiment, the word line voltage is stabilized by establishing a coupled up word line voltage as in, for example, FIG. 11A. After stabilizing the word line voltages, the read reference levels are calibrated. FIG. 12 depicts a flowchart of one embodiment of a process 1200 of calibrating read reference levels after an IR reflow in which word line voltages are stabilized. In one embodiment, process 1200 is performed by memory system 100. In one embodiment, process 1200 is performed by control circuitry 310 on memory die 300. In one embodiment, process 1200 is performed by control circuitry 310 on control die 308.

Step 1202 includes detecting that an IR reflow event. The memory system 100 may detect the IR reflow event as described in, for example, step 904 of process 900. Note that at the time of the IR reflow event there is data stored in the memory structure 326 at multiple bits per non-volatile memory cell.

Step 1204 includes transitioning the word line voltage from a non-coupled up state to a coupled up state in response to detecting that the IR reflow event has occurred. A coupled up state refers to the coupling up of the word line voltage that occurs due to applying a voltage such a Vread (see FIG. 6A) or Vdummy (see FIG. 11A) to the word lines, lowing the voltage, and then allowing the word line voltage to float. As noted herein, the foregoing results in the word line voltages to couple up due to the channel voltage first coupling down (see Vch_min in FIG. 6A or 11A) and then the channel voltage increasing.

A non-coupled up state refers to the word line voltages being at 0V, or close to 0V. A non-coupled up state may occur due to the memory system grounding the word lines, or applying a low voltage to the word lines. As a result, any coupling up of the word line voltages is discharged. A non-coupled up state may occur by the coupled up word line voltage dropping over a substantial time (e.g., 20 min).

Step 1206 includes determining new read reference levels while the word line voltages are coupled up. The word line voltages will stay coupled up for long enough to calibrate the read reference levels with the word line voltages in the coupled up state. Even if there is some very small amount of drop in the coupled up word line voltage it will not significantly impact calibration of the read reference levels.

Step 1208 includes reading the memory cells with the new read reference levels. Thus, the data that was stored in the memory cells at the time of the IR reflow event can be quickly and accurately read. Moreover, the memory cells store this data at multiple bits per memory cell, such that a large amount of data can be pre-loaded.

In view of the foregoing, it can be seen that a first embodiment includes, an apparatus, comprising d one or more control circuits configured to be connected to a memory structure having non-volatile memory cells. The one or more control circuits are configured to stabilize a condition in the memory structure after the memory structure has undergone a heating event. The non-volatile memory cells store data at multiple bits per memory cell when the heating event occurs. The one or more control circuits are configured to, while the condition of the memory structure remains stabilized, calibrate read reference levels for reading the non-volatile memory cells at the multiple bits per memory cell. The one or more control circuits are configured to read the data in the non-volatile memory cells at the multiple bits per memory cell with the calibrated read reference levels.

In a second embodiment, in furtherance of the first embodiment, the condition comprises threshold voltages of the non-volatile memory cells.

In third embodiment, in furtherance of the first or second embodiments, the condition comprises voltages of word lines connected to the non-volatile memory cells.

In fourth embodiment, in furtherance of any of the first to third embodiments, the one or more control circuits are configured to stabilize the condition in the memory structure after the memory structure has undergone the heating event by: performing a dummy read of at least a subset of the non-volatile memory cells in the memory structure; and waiting a pre-determined amount of time after performing the dummy read prior to calibrating the read reference levels.

In fifth embodiment, in furtherance of the fourth embodiment, the one or more control circuits are configured to perform the dummy read by: applying voltages to control gates of the subset of the non-volatile memory cells; removing the voltages that were applied to the control gates of the subset; and allowing the control gates of the subset to float after removing the voltages.

In sixth embodiment, in furtherance of the fourth or fifth embodiments, the apparatus further comprises the memory structure. The memory structure comprises a plurality of blocks of the non-volatile memory cells. The one or more control circuits are configured to perform the dummy read by applying a dummy voltage to all word lines in a selected block of the plurality of blocks, wherein the dummy voltage has a magnitude that is at least as high as a highest verify voltage used to verify when programming the memory cells to the multiple bits per memory; removing the dummy voltage from all the word lines in the selected block; and allowing all the word lines in the selected block to float after removing the dummy voltage.

In a seventh embodiment, in furtherance of any of the first to sixth embodiments, the one or more control circuits are configured to stabilize the condition in the memory structure after the memory structure has undergone the heating event by: performing one or more dummy reads of all of the non-volatile memory cells in the memory structure; and waiting a pre-determined amount of time after performing the one or more dummy reads prior to calibrating the read reference levels.

In an eighth embodiment, in furtherance of any of the first to seventh embodiments, the one or more control circuits are configured to stabilize the condition in the memory structure after the memory structure has undergone the heating event by coupling up voltages of word lines connected to the non-volatile memory cells to a coupled up voltage, wherein the one or more control circuits are configured to calibrate the read reference levels while the word line voltages remain at the coupled up voltage.

In a ninth embodiment, in furtherance of any of the first to eighth embodiments, the one or more control circuits are configured to calibrate the read reference levels by: sensing the non-volatile memory cells multiple times while the condition of the memory structure remains stabilized; and calibrating the read reference levels based on results of sensing the non-volatile memory cells.

In a tenth embodiment, in furtherance of any of the first to ninth embodiments, the heating event comprises an IR reflow. The one or more control circuits are further configured to detect the IR reflow.

In an eleventh embodiment, in furtherance of any of the first to tenth embodiments, the apparatus comprises the memory structure. The non-volatile memory cells store the data at three or more bits per memory cell when the heating event occurs. The read reference levels that the one or more control circuits calibrates while the condition is stabilized are read reference levels for reading at the three or more bits per memory cell.

In a twelfth embodiment, in furtherance of any of the first to eleventh embodiments, the apparatus comprises the memory structure. The memory structure comprises a three-dimensional memory array. The non-volatile memory cells are configured as NAND strings in the three-dimensional memory array.

One embodiment includes a method of operating a three-dimensional memory array. The method comprises programming data at multiple bits per memory cell in non-volatile memory cells in the three-dimensional memory array prior to an IR reflow event, wherein the three-dimensional memory array comprises word lines connected to the non-volatile memory cells. The method comprises detecting that the IR reflow event has occurred while the non-volatile memory cells store the data at the multiple bits per memory cell. The method comprises transitioning voltages of the word lines from a non-coupled up voltage to a coupled-up voltage in response to detecting that the IR reflow event has occurred. The method comprises determining, while the word lines voltages are still at the coupled up voltage, new read reference levels for reading the non-volatile memory cells at the multiple bits per cell. The method comprises reading the non-volatile memory cells at the multiple bits per cell with the new read reference levels.

One embodiment includes a non-volatile storage device, comprising a plurality of NAND strings comprising non-volatile memory cells, a plurality of word lines connected to the non-volatile memory cells, and a plurality of bit lines associated with the NAND strings. The non-volatile storage device further comprises means for performing one or more dummy reads of the non-volatile memory cells after an IR reflow event that impacts the non-volatile storage device. The non-volatile memory cells store data at multiple bits per cell when the IR reflow event occurs. The non-volatile storage device further comprises means waiting for voltages on the word lines to stabilize after performing the one or more dummy reads. The non-volatile storage device further comprises means for determining, while the voltages on the word lines are stab, new read reference voltages for reading the non-volatile memory cells at the multiple bit per memory cell. The non-volatile storage device further comprises means reading the data in the non-volatile memory cells at the multiple bits per memory cell using the new read reference voltages.

In one embodiment, the means for performing one or more dummy reads of the non-volatile memory cells after an IR reflow event that impacts the non-volatile storage device comprises one or more of: memory controller 102, control circuitry 310, state machine 312, address decoder 314, power control 316, read/write circuits 328, sense block 350, and/or decoders 324/332. In one embodiment, performing one or more dummy reads comprises performing process 1000.

In one embodiment, the means for waiting for voltages on the word lines to stabilize after performing the one or more dummy reads comprises one or more of: memory controller 102, control circuitry 310, state machine 312, address decoder 314, power control 316, read/write circuits 328, and/or decoders 324/332.

In one embodiment, the means for determining, while the voltages on the word lines are stabilized, new read reference voltages for reading the non-volatile memory cells at the multiple bit per memory cell comprises one or more of: memory controller 102, control circuitry 310, state machine 312, address decoder 314, power control 316, read/write circuits 328, sense block 350, and/or decoders 324/332.

In one embodiment, the means for reading the data in the non-volatile memory cells at the multiple bits per memory cell using the new read reference voltages comprises one or more of: memory controller 102, control circuitry 310, state machine 312, address decoder 314, power control 316, read/write circuits 328, sense block 350, and/or decoders 324/332.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
one or more control circuits configured to be connected to a memory structure having non-volatile memory cells, wherein the one or more control circuits are configured to:
stabilize a condition in the memory structure after the memory structure has undergone a heating event, wherein the non-volatile memory cells store data at multiple bits per memory cell when the heating event occurs;
while the condition of the memory structure remains stabilized, calibrate read reference levels for reading the non-volatile memory cells at the multiple bits per memory cell; and
read the data in the non-volatile memory cells at the multiple bits per memory cell with the calibrated read reference levels.

2. The apparatus of claim 1, wherein the condition comprises threshold voltages of the non-volatile memory cells.

3. The apparatus of claim 1, wherein the condition comprises voltages of word lines connected to the non-volatile memory cells.

4. The apparatus of claim 1, wherein the one or more control circuits are configured to stabilize the condition in the memory structure after the memory structure has undergone the heating event by:
performing a dummy read of at least a subset of the non-volatile memory cells in the memory structure; and
waiting a pre-determined amount of time after performing the dummy read prior to calibrating the read reference levels.

5. The apparatus of claim 4, wherein the one or more control circuits are configured to perform the dummy read by:
applying voltages to control gates of the subset of the non-volatile memory cells;
removing the voltages that were applied to the control gates of the subset; and
allowing the control gates of the subset to float after removing the voltages.

6. The apparatus of claim 5, further comprising the memory structure, wherein the memory structure comprises a plurality of blocks of the non-volatile memory cells, wherein:
the one or more control circuits are configured to perform the dummy read by:
applying a dummy voltage to all word lines in a selected block of the plurality of blocks, wherein the dummy voltage has a magnitude that is at least as high as a highest verify voltage used to verify when programming the memory cells to the multiple bits per memory;
removing the dummy voltage from all the word lines in the selected block; and
allowing all the word lines in the selected block to float after removing the dummy voltage.

7. The apparatus of claim 1, wherein the one or more control circuits are configured to stabilize the condition in the memory structure after the memory structure has undergone the heating event by:

performing one or more dummy reads of all of the non-volatile memory cells in the memory structure; and waiting a pre-determined amount of time after performing the one or more dummy reads prior to calibrating the read reference levels.

8. The apparatus of claim 1, wherein the one or more control circuits are configured to stabilize the condition in the memory structure after the memory structure has undergone the heating event by:

coupling up voltages of word lines connected to the non-volatile memory cells to a coupled up voltage, wherein the one or more control circuits are configured to calibrate the read reference levels while the word line voltages remain at the coupled up voltage.

9. The apparatus of claim 1, wherein the one or more control circuits are configured to calibrate the read reference levels by:

sensing the non-volatile memory cells multiple times while the condition of the memory structure remains stabilized; and calibrating the read reference levels based on results of sensing the non-volatile memory cells.

10. The apparatus of claim 1, wherein:

the heating event comprises an IR reflow; and the one or more control circuits are further configured to detect the IR reflow.

11. The apparatus of claim 1, further comprising the memory structure, wherein:

the non-volatile memory cells store the data at three or more bits per memory cell when the heating event occurs; and the read reference levels that the one or more control circuits calibrates while the condition is stabilized are read reference levels for reading at the three or more bits per memory cell.

12. The apparatus of claim 1, further comprising the memory structure, wherein:

the memory structure comprises a three-dimensional memory array; and the non-volatile memory cells are configured as NAND strings in the three-dimensional memory array.

13. A method of operating a three-dimensional memory array, the method comprising:

programming data at multiple bits per memory cell in non-volatile memory cells in the three-dimensional memory array prior to an IR reflow event, wherein the three-dimensional memory array comprises word lines connected to the non-volatile memory cells;

transitioning voltages of the word lines from a non-coupled up voltage to a coupled-up voltage after the IR reflow event has occurred;

determining, while the word lines voltages are still at the coupled up voltage, new read reference levels for reading the non-volatile memory cells at the multiple bits per cell; and reading the non-volatile memory cells at the multiple bits per cell with the new read reference levels.

14. The method of claim 13, wherein determining, while the word lines voltages are still at the coupled up voltage, the new read reference levels for reading the non-volatile memory cells at the multiple bits per cell comprises:

sensing the non-volatile memory cells multiple times while the word line voltages are still at the coupled up voltage.

15. The method of claim 14, wherein transitioning the word line voltages from the non-coupled up voltage to the coupled-up voltage comprises:

performing a dummy read of the non-volatile memory cells, wherein performing the dummy read includes applying a voltage to control gates of the memory cells that is at least as great as a highest verify voltage used to verify the memory cells when programming the data at the multiple bits per memory cell; and waiting a pre-determined amount of time after performing the dummy read prior to sensing the non-volatile memory cells multiple times while the word line voltages are still coupled up.

16. The method of claim 13, further comprising detecting that the IR reflow event has occurred while the non-volatile memory cells store the data at the multiple bits per memory cell.

17. A non-volatile storage device, comprising:

a plurality of NAND strings comprising non-volatile memory cells;

a plurality of word lines connected to the non-volatile memory cells;

a plurality of bit lines associated with the NAND strings; and means for performing one or more dummy reads of the non-volatile memory cells after an IR reflow event that impacts the non-volatile storage device, wherein the non-volatile memory cells store data at multiple bits per cell when the IR reflow event occurs;

means for waiting for voltages on the word lines to stabilize after performing the one or more dummy reads;

means for determining, while the voltages on the word lines are stabilized, new read reference voltages for reading the non-volatile memory cells at the multiple bit per memory cell; and means for reading the data in the non-volatile memory cells at the multiple bits per memory cell using the new read reference voltages.

18. The non-volatile storage device of claim 17, wherein the means for performing one or more dummy reads comprise:

means for increasing a voltage on the word lines to a dummy voltage;

means for decreasing the voltage on the word lines from the dummy voltage to a steady state voltage; and means for allowing the word lines to float after decreasing the voltage on the word lines to the steady state voltage.

19. The non-volatile storage device of claim 18, wherein the dummy voltage has a magnitude that is at least as great as a highest verify voltage that is used by the one or more control circuits to verify that the data is successfully programmed to the multiple bits per cell.

20. The non-volatile storage device of claim 17, wherein the means for performing one or more dummy reads comprise:

means for applying a dummy read voltage to each non-volatile memory cell on each NAND string of the plurality of NAND strings.

21. The non-volatile storage device of claim 17, further comprising:

means for storing the data in the non-volatile memory cells at the multiple bits per memory cell prior to the IR reflow; and means for detecting the IR reflow while the non-volatile memory cells store the data at the multiple bits per memory cell.

* * * * *